(12) United States Patent
Hess et al.

(10) Patent No.: US 11,592,471 B2
(45) Date of Patent: *Feb. 28, 2023

(54) MONITORING SYSTEMS FOR INDUSTRIAL MACHINES HAVING DYNAMICALLY ADJUSTABLE COMPUTATIONAL UNITS

(71) Applicant: Bently Nevada, LLC, Minden, NV (US)

(72) Inventors: Dustin Hess, Minden, NV (US); Michael Alan Tart, Gardnerville, NV (US)

(73) Assignee: BENTLY NEVADA, LLC, Minden, NV (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/326,786

(22) Filed: May 21, 2021

(65) Prior Publication Data
US 2022/0113347 A1   Apr. 14, 2022

Related U.S. Application Data

(63) Continuation of application No. 15/947,762, filed on Apr. 6, 2018, now Pat. No. 11,016,141.

(51) Int. Cl.
*G01R 31/28* (2006.01)
*G05B 19/418* (2006.01)
*G05B 19/4065* (2006.01)

(52) U.S. Cl.
CPC ..... *G01R 31/2801* (2013.01); *G05B 19/4065* (2013.01); *G05B 19/4185* (2013.01); *G05B 2219/33328* (2013.01)

(58) Field of Classification Search
CPC ...... G01R 31/2801; G05B 2219/33328; G05B 19/4185; G05B 19/4065
(Continued)

(56) References Cited

U.S. PATENT DOCUMENTS 6,738,692 B2 * 5/2004 Schienbein ........... H02M 7/003
                                                                       700/286
8,301,404 B2 * 10/2012 Wright ............... G01R 19/2513
                                                                       700/297
(Continued)

*Primary Examiner* — Aditya S Bhat
(74) *Attorney, Agent, or Firm* — Mintz Levin Cohn Ferris Glovsky and Popeo, PC; Lisa Adams

(57) ABSTRACT

A flexible monitoring system and corresponding methods of use are provided. The system can include a base containing backplane, and one or more monitoring circuits. The monitoring circuits can be designed with a common architecture that is programmable to perform different predetermined functions. As a result, monitoring circuits can be shared between different implementations of the flexible monitoring system. Multiple bases that can be communicatively coupled in a manner that establishes a common backplane between respective bases that is formed from the individual backplanes of each base. Each monitoring circuit is not limited to sending data to and/or receiving data from the backplane to which it is physically coupled but can instead can communicate along the common backplane. Computational processing capacity can be increased or decreased independently of input signals received by addition or removal of processing circuits from the monitoring system.

20 Claims, 12 Drawing Sheets

(58) Field of Classification Search
USPC .......................................................... 702/117
See application file for complete search history.

(56) References Cited

U.S. PATENT DOCUMENTS 10,409,274 B1 * 9/2019 Urrea ................. G05B 23/0254
11,112,449 B2 * 9/2021 Tart ................... G05B 19/4185

* cited by examiner

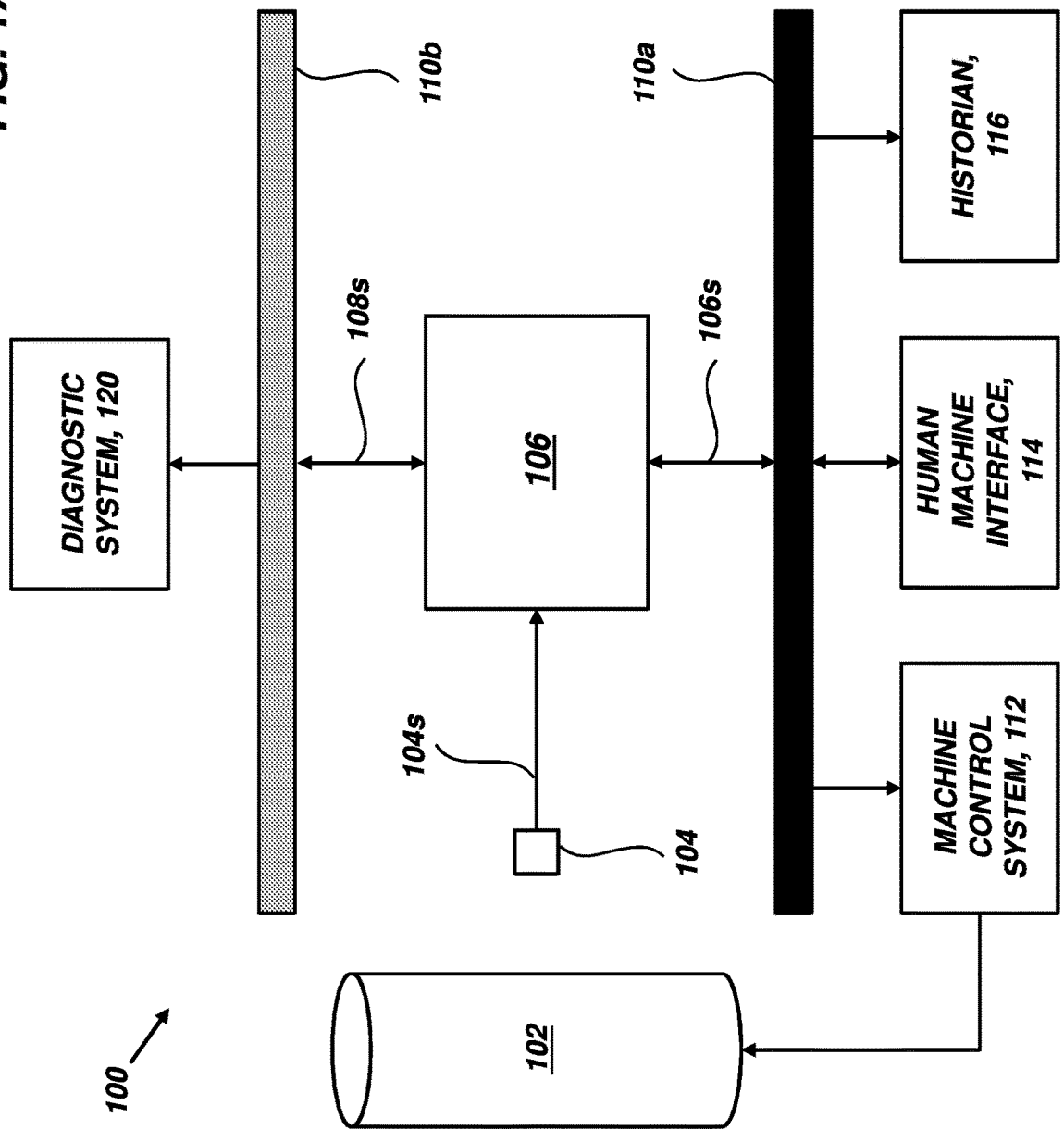

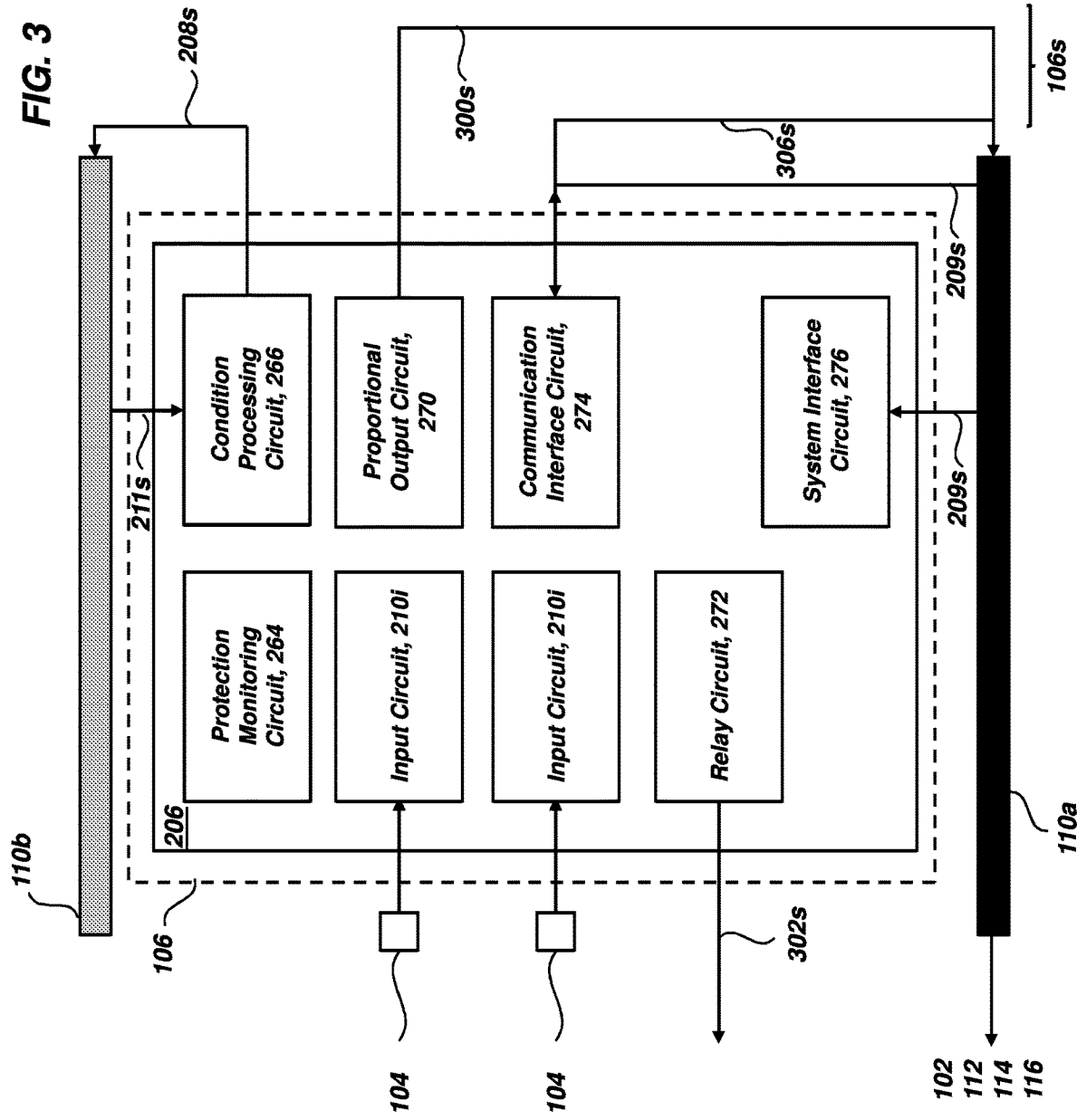

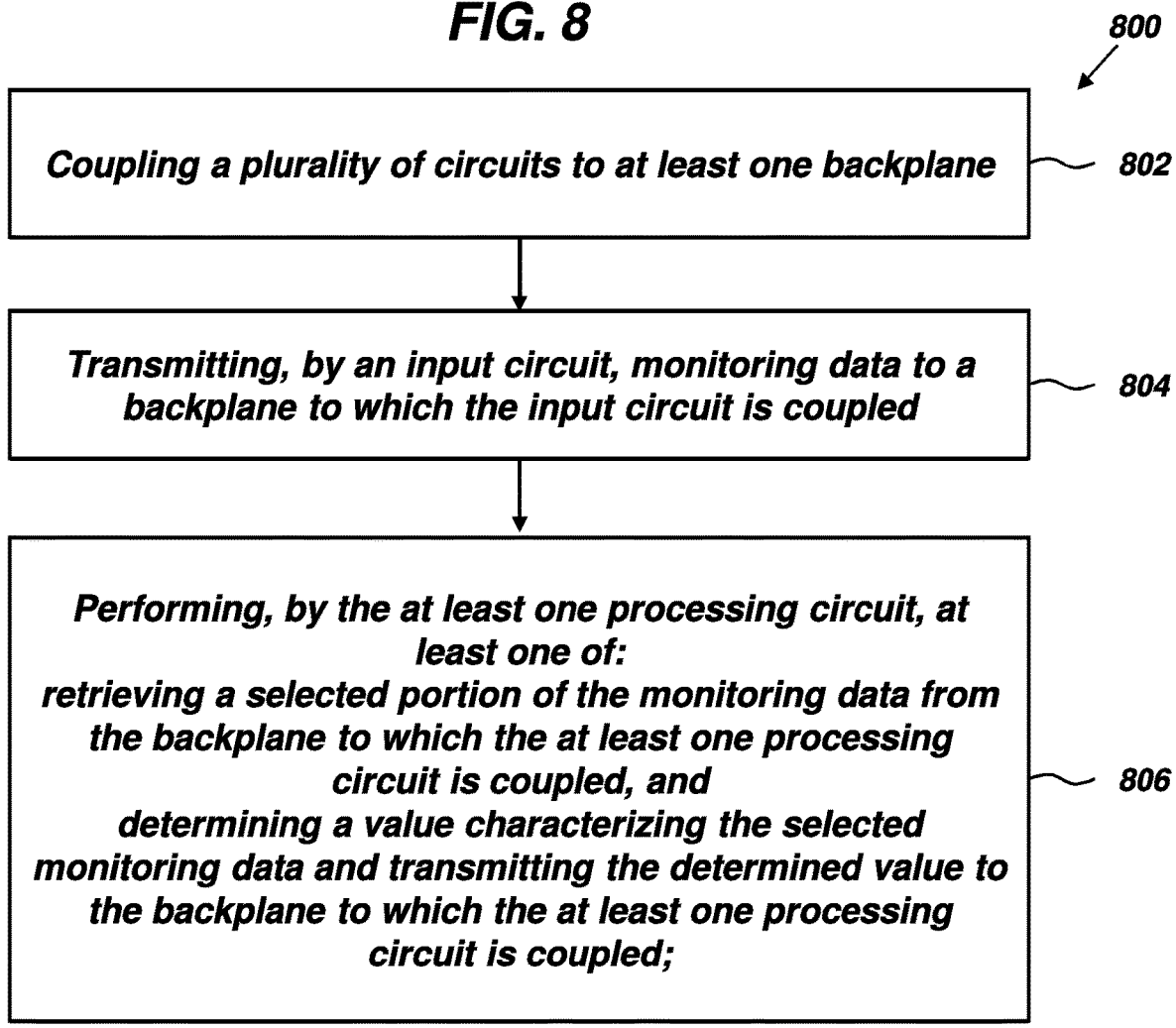

MONITORING SYSTEMS FOR INDUSTRIAL MACHINES HAVING DYNAMICALLY ADJUSTABLE COMPUTATIONAL UNITS

CROSS-REFERENCE TO RELATED APPLICATIONS

This application is a continuation of U.S. patent application Ser. No. 15/947,762 entitled "Monitoring Systems for Industrial Machines Having Dynamically Adjustable Computational Units," filed Apr. 6, 2018, which is hereby incorporated herein by reference in its entirety.

BACKGROUND

Many industries, such as hydrocarbon refining and power generation, can rely heavily upon operation of machinery, and in some instances, continuous operation of machinery. In these environments, failure of one or more machines can incur significant costs due to repair expenses as well as loss of production and potential injury to workers. Given these risks, it can be common to monitor certain operating parameters of one or more machine components. Measurements of the operating parameters can provide an indication of the mechanical condition of a machine component, allowing preventative maintenance (e.g., repair, replacement, etc.) to be performed on the machine component prior to failure. This monitoring can provide one or more long term benefits, such as lower production costs, reduced equipment down time, improved reliability, and enhanced safety.

SUMMARY

In general, systems and methods are provided for protection and/or condition monitoring of machines, such as industrial machines.

In one embodiment, a system is provided and it can include at least one backplane, an input circuit, and at least one processing circuit. The at least one backplane can be configured to couple to a plurality of circuits and to receive monitoring data from at least one of the plurality of circuits coupled to the backplane. The input circuit can be coupled to one of the at least one backplane and it can be configured to receive a sensor signal representing monitoring data including measurements of an operating parameter of a machine component from a sensor. The input circuit can also be configured to transmit the monitoring data to the backplane to which the input circuit is coupled. The at least one processing circuit can be coupled to a backplane of one of the at least one backplane. The at least one processing circuit can be configured to perform at least one of retrieving a selected portion of the monitoring data from the backplane to which the at least one processing circuit is coupled, and determining a value characterizing the selected monitoring data and transmitting the determined value to the backplane to which the at least one processing circuit is coupled. The number of processing circuits coupled to the at least one backplane can be independent from the number of input circuits coupled to the at least one backplane.

In another embodiment, the system can include a first processing circuit and a second processing circuit. The first processing circuit can be a first protection processing circuit coupled to a first backplane. The first protection processing circuit can be configured to retrieve a first portion of the monitoring data from the first backplane, to determine a first portion of the value based upon the first portion of the monitoring data, and to transmit the first portion of the value to the first backplane. The second processing circuit can be a second protection processing circuit coupled to a second backplane. The second protection processing circuit can be configured to retrieve a second portion of the monitoring data, different from the first portion, determine a second portion of the value based upon the second portion of the monitoring data, and to transmit the second portion of the value to the second backplane.

In another embodiment, the first protection processing circuit can be configured to retrieve the second portion of the value from the second backplane, to determine the value based upon the first and second value portions, and to transmit the determined value to the first backplane.

In another embodiment, the first and second backplanes can be the same backplane.

In another embodiment, the input circuit can be coupled to the first backplane.

In another embodiment, the input circuit can be coupled to a third backplane, different from the first backplane and the system can further include a first bridge circuit and a second bridge circuit. The first bridge circuit can be coupled to the first backplane. The second bridge circuit can be coupled to the third backplane and it can be in communication with the first bridge circuit. The first and second bridge circuits can form a common logical backplane including the first and third backplanes. The first and second protection processing circuits can be configured to retrieve the first and second monitoring data portions from the third backplane via the common logical backplane.

In another embodiment, the first and second backplanes can be different backplanes and the system can further include a first bridge circuit and a second bridge circuit. The first bridge circuit can be coupled to the first backplane. The second bridge circuit can be coupled to the second backplane and it can be in communication with the first bridge circuit. The first and second bridge circuits can form a common logical backplane including the first and second backplanes. The first protection processing circuit can be configured to retrieve the second portion of the value from the second backplane via the common logical backplane.

In another embodiment, the system can include a first processing circuit and a second processing circuit. The first processing circuit can be a first condition processing circuit coupled to a first backplane. The first condition processing circuit can be configured to retrieve a first portion of the monitoring data from the first backplane and to output the first portion of the monitoring data to a network. The second processing circuit can be a second condition processing circuit coupled to a second backplane. The second condition processing circuit can be configured to retrieve a second portion of the monitoring data from the second backplane, and to output the second portion of the monitoring data to the network. The first and second condition processing circuits can be prohibited from transmitting data to any of the at least one backplane.

In another embodiment, the first and second backplanes can be the same backplane.

In another embodiment, the input circuit can be coupled to the first backplane.

In another embodiment, the input circuit can be coupled to a third backplane, different from the first backplane, and the system can further include a first bridge circuit and a second bridge circuit. The first bridge circuit can be coupled to the first backplane. The second bridge circuit can be coupled to the third backplane and it can be in communication with the first bridge circuit. The first and second bridge circuits can form a common logical backplane including the first and third backplanes. The first and second condition processing circuits can be configured to retrieve the first and second monitoring data portions from the third backplane via the common logical backplane.

Methods for monitoring a machine are also provided. In one embodiment, the method can include coupling a plurality of circuits to at least one backplane. The plurality of circuits can include an input circuit and at least one processing circuit. In another embodiment, the method can include transmitting, by the input circuit, monitoring data to the backplane to which the input circuit is coupled. The monitoring data can represent measurements of an operating parameter of a machine component acquired by a sensor. The method can further include performing, by the at least one processing circuit, at least one of: retrieving a selected portion of the monitoring data from the backplane to which the at least one processing circuit is coupled, and determining a value characterizing the selected monitoring data and transmitting the determined value to the backplane to which the at least one processing circuit is coupled. The number of processing circuits coupled to the at least one backplane can be selected independently from the number of input circuits coupled to the at least one backplane.

In another embodiment, the method can include retrieving, by a first processing circuit, a first portion of the monitoring data from the first backplane. The first processing circuit can be a first protection processing circuit coupled to a first backplane. The method can also include determining, by the first protection processing circuit, a first portion of the value based upon the first portion of the monitoring data. The method can further include transmitting the first portion of the value to the first backplane. The method can also include retrieving, by a second protection processing circuit, a second portion of the monitoring data from the second backplane. The second protection processing circuit can be a second processing circuit coupled to a second backplane. The method can further include determining, by the second protection processing circuit, a second portion of the value based upon the second portion of the monitoring data. The method can additionally include transmitting the second portion of the value to the second backplane.

In another embodiment, the method can include retrieving, by the first protection processing circuit, the second portion of the value from the second backplane. The method can also include determining, by the first protection processing circuit, the value based upon the first and second value portions. The method can further include transmitting, by the first protection processing circuit, the determined value to the first backplane.

In another embodiment, the first and second backplanes can be the same backplane.

In another embodiment, the method can include coupling the input circuit to the first backplane.

In another embodiment, the input circuit can be coupled to a third backplane, different from the first backplane and the method can include coupling a first bridge circuit to the first backplane. The method can also include coupling a second bridge circuit to the third backplane. The method can further include placing the first and second bridge circuits in communication. The first and second bridge circuits can form a common logical backplane including the first and third backplanes when in communication. The first and second protection processing circuits can be configured to retrieve the first and second monitoring data portions from the third backplane via the common logical backplane.

In another embodiment, the first and second backplanes can be different backplanes, and the method can include coupling a first bridge circuit to the first backplane, coupling a second bridge circuit to the second backplane, and placing the first and second bridge circuits in communication. The first and second bridge circuits can form a common logical backplane including the first and second backplanes when in communication. The first protection processing circuit can be configured to retrieve the second portion of the value from the second backplane via the common logical backplane.

In another embodiment, the method can include retrieving, by a first processing circuit a first portion of the monitoring data from the first backplane. The first processing circuit can be a first condition processing circuit coupled to a first backplane. The method can also include outputting, by the first condition processing circuit, the first portion of the monitoring data to a network. The method can further include retrieving, by a second processing circuit, a second portion of the monitoring data from the second backplane. The second processing circuit can be a second condition processing circuit coupled to a second backplane. The method can also include outputting, by the second condition processing circuit, the second portion of the monitoring data to the network. The first and second condition processing circuits can be prohibited from transmitting data to the first and second backplanes, respectively.

In another embodiment, the first and second backplanes can be the same backplane.

In another embodiment, the input circuit can be coupled to the first backplane.

In another embodiment, the input circuit can be coupled to a third backplane, different from the first backplane, and the method can include coupling a first bridge circuit to the first backplane, coupling a second bridge circuit to the third backplane, and placing the first and second bridge circuits in communication. The first and second bridge circuits can form a common logical backplane including the first and third backplanes when in communication. The first and second condition processing circuits can be configured to retrieve the first and second monitoring data portions from the third backplane via the common logical backplane.

DESCRIPTION OF DRAWINGS

These and other features will be more readily understood from the following detailed description taken in conjunction with the accompanying drawings, in which:

FIG. 1A is a diagram illustrating one exemplary embodiment of an operating environment containing an existing monitoring system;

FIG. 3 is a diagram illustrating one exemplary embodiment of a backplane of the flexible monitoring system of FIG. 2A;

FIG. 8 is a flow diagram illustrating one exemplary embodiment of a method for monitoring a machine.

Figure 1B:
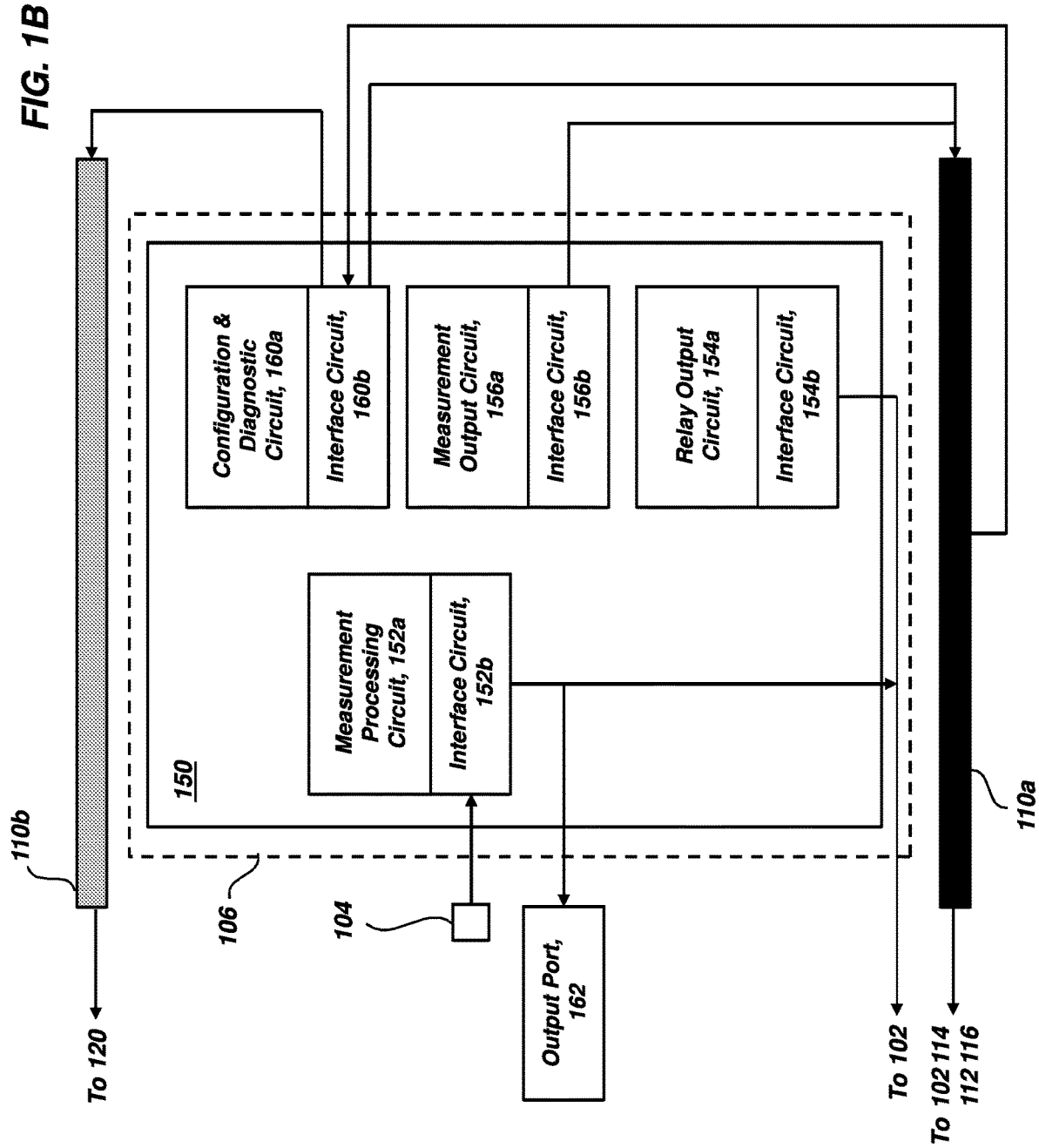
FIG. 1B is a diagram illustrating one exemplary embodiment of a backplane of the monitoring system of FIG. 1A.

It is noted that the drawings are not necessarily to scale. The drawings are intended to depict only typical aspects of the subject matter disclosed herein, and therefore should not be considered as limiting the scope of the disclosure.

DETAILED DESCRIPTION

Industrial machinery, such as wind turbines, can be monitored by monitoring systems to ensure operation within acceptable tolerances. In general, machine monitoring can include measuring operating parameters of one or more of the machine components, determining whether the machine components are operating properly from the operating parameter measurements, and issuing warnings if a machine component is determined to be operating improperly. These warnings can allow corrective action to taken in advance of machine failure, providing benefits such as lower production costs, reduced equipment down time, improved reliability, and/or improved safety.

However, existing monitoring systems can be relatively inflexible. As an example, manufacturers can make different types of monitoring systems that have different capabilities, referred to as models or implementations. Different monitoring system implementations can include components, such as inputs, outputs, and processors, that are designed for use only with their specific implementation. The inability to share components between different monitoring system implementations can require development of new components for each new implementation, rather than utilizing already created components and can slow the deployment of new monitoring system implementations. In another example, different monitoring system implementations can require more resources (e.g., spare hardware and software, trained personnel, etc.) to manage, as each can include different specialized components that can behave differently. Accordingly, embodiments of the disclosure provide flexible monitoring systems include circuits that share a common architecture (e.g., hardware, software, firmware, etc.) and each circuit can be configured to perform a different designated function (e.g., input, processing, output, system operation, etc.). By separating functions of the flexible monitoring system into different circuits, new implementations of the flexible monitoring system can be developed, in some case rapidly, by arranging already created components in different combinations. In particular, if a new application requires additional processing power than existing implementation of the flexible monitoring system, processing circuits having greater capability and/or more processing circuits can be added without the need to develop a new implementation of the flexible monitoring system.

Embodiments of systems and corresponding methods for monitoring industrial machines are discussed herein. However, embodiments of the disclosure can be employed for monitoring other machines without limit.

An operating environment 100 containing an existing monitoring system 102 is illustrated in FIG. 1. The operating environment 100 can include a target 102, a sensor 104, and a monitoring system 106 in communication with an internal network 110a and an external network 110b.

The target 102 can be any component of any machine. Examples of targets 102 can include gears, bearings, and shafts, amongst others. Examples of machines can include turbomachines, turbines (e.g., hydro, wind), generators, and reciprocating compressors.

The sensor 104 can be configured to sense an operating parameter of the target 102, generate at least one sensor signal 104s representing the measured operating parameter, and to transmit the sensor signal 104s to the monitoring system 106 (e.g., via field wiring). As an example, the sensor 104 can include a probe, a transducer, and a signal conditioning circuit (not shown). The probe can interact with the target 102 for measurement of the operating parameter. The transducer can convert measurements of the operating parameter into an electrical signal (e.g., a voltage). The signal conditioning circuit can condition and/or amplify the electrical signal to generate the sensor signal 104s (e.g., a voltage ranging between a minimum and maximum). Thus, in one aspect, the sensor signal 104s can contain the direct or raw measurement made by the sensor transducer. The sensor signal 104s can be an analog signal or a digital signal.

In another aspect, the sensor signals 104s can also include an enhanced data set, in addition to the direct measurements of the operating parameter. The enhanced data set can contain a variety of measured variables that depend upon the type of operating parameter being measured. As an example, the target 102 can be a rotating component, such as a shaft, and radial vibration can be a variable measured by a sensor 104 in the form of a proximity sensor. Under these circumstances, the enhanced data set can include one or more of a gap voltage, a 1× filtered amplitude, a 2× filtered amplitude, a 1× filtered phase, a 2× filtered phase, Not 1× amplitude, and maximum shaft displacement (Smax). Gap voltage is the voltage output by the probe and represents the physical distance between the target 102 and a tip of the probe. 1× amplitude is the amplitude of vibrations having the same frequency as the shaft rotation, while 2× amplitude is the amplitude of vibrations having a frequency twice that of the shaft rotation. For instance, a rotation speed of 1480 revolutions per minute corresponds to a frequency of 24.6$\overline{6}$ cycles per second (Hz). Phase is the time delay between a vibration measured at a predetermined measurement location with respect to a reference location. Thus, 1× phase refers to phase of vibrations having the same frequency as the shaft rotation, while 2× phase refers to phase of vibrations having a frequency twice that of the shaft rotation. Not 1× amplitude refers to all amplitudes except for the 1× amplitude. In other embodiments, the enhanced data set can include metadata regarding one or more components of the sensor 104, such as the transducer. Examples of metadata can include one or more of a serial number, revision number, operating temperature, and state of health.

The number and type of sensor 104 can be dictated by the operating parameter(s) that are intended to be measured. In one aspect, the sensor 104 can take the form of one or more proximity probes for measurement of vibration, position, speed, direction of motion, and eccentricity. In another aspect, the sensor 104 can take the form of one or more accelerometers for measurement of seismic vibration and acceleration. In a further aspect, the sensor 104 can take the form of one or more temperature probes or pressure probes for measurement of temperature and pressure, respectively. It can be understood that the sensor types and corresponding operating parameters listed above are not exhaustive and embodiments of the sensor 104 can include any sensor or combination of sensors suitable for measurement of operating parameters of interest.

In use, the monitoring system 106 can be configured to process the received sensor signals 104s and output monitoring signals 106s, 108s. As an example, the monitoring system 106 can be configured to determine a value characterizing the operating parameter measurement. The monitoring system 106 can also compare this determined value, and/or any measured variables of the enhanced data set, to a corresponding predetermined alarm conditions in real-time and determine an alarm status (e.g., OK, not OK, alert, danger, etc.). For instance, when the target 102 is a rotating shaft and the measured operating parameter is radial vibration of the shaft, the sensor signal 104s can include a shaft displacement as a function of time. From this sensor signal, the monitoring system 106 can determine the value of vibration amplitude from the peak-to-peak displacement.

The monitoring system 106 can also be configured to output monitoring signals 106s, 108s to the internal network 110a and/or the external network 110b. The output monitoring signals 106a, 108a can include one or more of the measured variables of the enhanced data set, the determined values, and the determined status. Alarm statuses, such as alert and danger, can be annunciated via physical relays on the monitoring system 106 or to the external systems 110 by the monitoring signals 106s, 108s. In another aspect, the monitoring system 106 can additionally or alternatively store the sensor signals 104s for later processing.

The internal network 110a can be a plant network that is in communication with a machine control system 112. The machine control system 112 can be configured to provide commands to a machine operative to control one or more operating parameters of the target 102. The internal network 110a can also be in communication with other systems, such as computing devices executing configuration software (not shown), human-machine interfaces (HMIs) 114 and/or a customer historian 116. The configuration software can be used to provide configuration information, such as the pre-determined alarm conditions, to the monitoring system 106. The HMI 114 can be one or more computing devices in communication with user interface devices (e.g., displays) allowing an operator of the machine to review measured operating parameters and/or provide instructions to the machine control system 112.

So configured, the monitoring system 106 can facilitate protection of a machine containing the target 102. As an example, in response to annunciation of an alarm status, the machine control system 112 can be utilized to control operation of the target 102 (e.g., automatically according to programmed logic or manually using the HMI 114) to cause the measured operating parameters to change and move out of the alarm status. Under extreme circumstances, the machine control system 112 can be employed to shut down operation of the machine to protect the target 102 from damage and/or workers from injury. The historian 116 can store any of the data contained within the monitoring signals 106s.

The external network 110b can be a business network that is in communication with a diagnostic system 120. The diagnostic system 120 can analyze any of the data contained within the monitoring signals 108s received from the monitoring system 106 to diagnose improper operation of the target 102 and/or predict improper operation of the target 102 before it occurs. Thus, by providing monitoring signals 108s to the external network 110b, the monitoring system 106 can facilitate condition monitoring of the target 102.

The monitoring system 106 is illustrated in greater detail in FIG. 1B. As shown, the monitoring system 106 includes a backplane 150 that can be configured to allow communication between different components coupled thereto. The components can include a measurement processing circuit 152a, a relay output circuit 154a, a measurement output circuit 156a, a configuration and diagnostic circuit 160a, and corresponding interface circuits 152b, 154b, 156b, 160b. The interface circuits 152b, 154b, 156b, 160b can provide hardware interfaces for communication to and from their respective circuits 152a, 154a, 156a, 160a. The individual circuits 152a, 154a, 156a, 160a can communicate selected information on the backplane 150 using protocols running on buses formed from passive traces extending across the backplane 150.

In one aspect, the measurement processing circuit 152a can be coupled to an interface circuit 152b such that sensor signals 104s received by the interface circuit 152b are transmitted directly to the measurement processing circuit 152a. That is, the sensor signals 104s are not transmitted to the backplane 150. The sensor signals 104s can be accessed by an operator through an output port 162. Multiple measurement processing circuits 152a and interface circuit 152b can be present, on a one-to-one basis, for receipt of the sensor signals 104s. As discussed above, the measurement processing circuit 152a can be configured to determine one or more values for the operating parameter measurements contained within the received sensor signal 104s. The measurement processing circuit 152a can also compare determined values, and/or measured variables of the enhanced data, to pre-determined alarm conditions in real-time and determine a status for the target 102. The measurement processing circuit 152a can further output signals representing the measured variables of the enhanced data, the determined values, and the determined statuses to the backplane 150.

The measurement processing circuit 152a can also format process variables (e.g., determined values, measured variables of the enhanced data set, annunciated alarms, etc.) for output to the machine control system 112. As an example, the format can be a current that ranges between about 4 mA to about 20 mA (also referred to as 4-20) and is proportional to the determined values and/or measured variable as compared to a corresponding scale. The machine control system 112 can utilize the process variables for process control of the target 102.

The statuses determined by the measurement processing circuits 152a can be retrieved by the relay processing circuit 154a from the backplane 150. The relay processing circuit 154a can include relays that are programmed to actuate based upon received alarm statuses to annunciate an alarm. In one example, relays can actuate based upon a single status. In another example, relays can actuate based upon Boolean expressions (e.g., AND or voting) that combine two or more statuses. The relay processing circuit 154a can also output signals representing annunciated alarms directly to the machine control system 112 for process control of the target 102. As an example, the machine control system 112 can shut down operation of the target 102 upon receipt of an alarm annunciation. Annunciated alarms can also be used to provide indications and/or to drive into digital input of the machine control system 112, the HMI 114, or historian 116.

The measurement output circuit 156a can retrieve data such as determined values, measured variables of the enhanced data, determined statuses, and annunciated alarms from the backplane 150 for transmission to the internal network 110a. Upon receipt, the retrieved data can be stored by the historian 116 and/or reviewed by an operator using the HMI 114.

The configuration and diagnostic circuit 160a can receive first configuration commands from the internal network 110a and transmit the first configuration commands to the backplane 150 for use by the circuits 152a, 154a, 156a, 160a. The first configuration commands can provide one or more set points for use by the measurement processing circuit 152a in determining statuses. The first configuration commands can also provide logic instructions and identify statuses to be used by the relay output circuit 154a for alarm annunciation. The first configuration commands can further identify data such as determined values, measured variables of the enhanced data, determined statuses, and/or annunciated alarms to be retrieved from the backplane 150 by the measurement output circuit 156a and transmitted to the internal network 110a.

The configuration and diagnostic circuit 160a can also receive second configuration commands from the internal network 110a. The second configuration commands can identify data such as determined values, measured variables of the enhanced data, determined statuses, and annunciated alarms to be retrieved from the backplane 150 and transmitted to the external network 110b for use by the diagnostic system 120.

Monitoring system 106 can be applied to a large variety of monitoring applications (e.g., machines having different components to be monitored). Each application can require different amounts of computational processing power. As an example, very little processing power can be required in the case of a low count protection monitoring system that measures thrust. In contrast, a large steam and gas combined cycle application can require multiple sensors and associated measurements. Still other applications, such as variable speed gearboxes, can involve the use of complex analytics and relatively large amount of processing power.

To address this issue of variable computation demands, the measurement monitoring system 106 can be configured such that the interface circuit 152b is coupled to a designated measurement processing circuit 152a, on a one-to-one basis. This architecture can ensure that sensor signals 104s, received by a given interface circuit 152b, are paired with a measurement processing circuit 152a that has been specifically designed with sufficient computing power to perform one or more desired analyses of the received sensor signal 104s. To reduce cost of the monitoring system 106, the amount of computing power possessed by each of the measurement processing circuits 152a can be just enough for the intended application.

However, this design architecture can result in development of many different implementations of the monitoring system 106, each having its own unique architecture and tools. Also, new applications can be more difficult to instrument because the existing monitoring systems 106 can lack flexibility to meet adjusted computing requirements and can result in the need to develop another implementation of the monitoring device 106. While some of these issues can be addressed by the use of a relatively large implementation of the monitoring device 106 that contains enough processing power to fit most applications, there can still be applications that require even more processing power. Furthermore, such a large and computationally powerful device can be too expensive to deploy for monitoring of machines that only require a small amount of computing power.

Figure 2A:
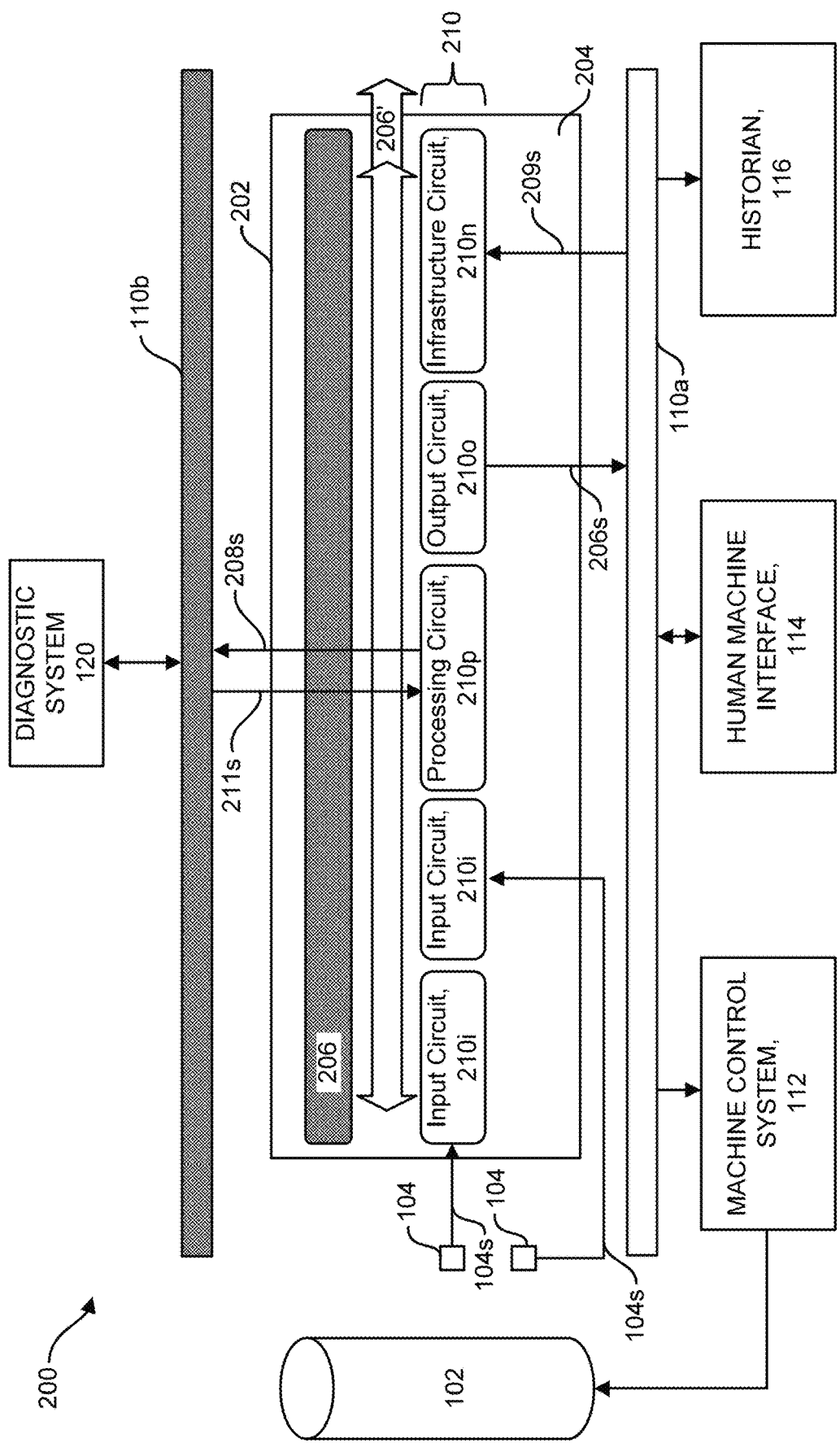
FIG. 2A is a diagram illustrating one exemplary embodiment of an operating environment containing a flexible monitoring system configured to monitor a machine.

One or more of these limitations can be addressed by embodiments of a flexible monitoring system of the present disclosure. FIG. 2A illustrates an exemplary embodiment of an operating environment 200 including a flexible monitoring system 202. The operating environment 200 can be similar to the operating environment 100, except that the monitoring system 106 is replaced with the flexible monitoring system 202. The flexible monitoring system 202 can include a base 204 containing a backplane 206, and one or more circuits 210. The backplane 206 can be configured to communicatively couple with two or more circuits 210 and receive data from at least one circuit 210 coupled thereto. As discussed herein, data transmitted to the backplane 206 can be referred to as monitoring data. In one aspect, monitoring data can include information contained within the sensor signals 104s, such as measured operating parameters of the target 102 and measured variables of the enhanced data set. Monitoring data can also include any values, statuses, and/or annunciated alarms that are determined based upon the measured operating parameters of the target 102 and/or measured variables of the enhanced data set. Circuit 210 coupled to the backplane 206 can retrieve monitoring data from the backplane 206. In certain embodiments, the backplane 206 can be passive. A passive backplane can contain substantially no or no logical circuitry that performs computing functions. Desired arbitration logic can be placed on daughter cards (e.g., one or more of the circuits 210) plugged into or otherwise communicatively coupled to the passive backplane.

In contrast to the circuits 152a, 154a, 156a, 160a of the monitoring system 106, the circuits 210 can be designed with a common architecture that is programmable to perform different predetermined functions of the flexible monitoring system 202. Sensor signals 104s received by one or more of the circuits 210 can be transmitted to the backplane 206 and monitoring data represented by the sensor signals 104s can be accessed by any circuit 210. This uniform architecture can reduce the number of deployed implementations of the flexible monitoring system 202 and allow sharing of monitoring circuits 210 between different implementations of the flexible monitoring system 202, each of which can reduce maintenance and system costs. The same look and feel can also be maintained across all implementations of the flexible monitoring system 202, which can reduce confusion during operation and upkeep.

Furthermore, the flexible monitoring system 202 can include multiple bases 204 that are communicatively coupled in a manner that establishes a common backplane 206' between respective bases 204 (e.g., a logical backplane). This common backplane 206' can be formed from the individual backplanes 206 of each base 204. Thus, each monitoring circuit 210 can communicate along the common backplane 206' and is not limited to sending data to and/or receiving data from the backplane 206 to which it is physically coupled.

Additionally, as discussed below, the computational units of the flexible monitoring system 202, referred to herein as processing circuits, can be separated from the input circuits that receive sensor signals 104s. As a result, the number of processing circuits that are coupled to the backplane 206 can be independent from the number of input circuits coupled to the backplane 206. The ability of monitoring circuits 210 to communicate across different bases 204, in combination with the ability to share monitoring circuits 210 between different implementations of the flexible monitoring system 202, can allow processing circuits to be added or removed for adjustment of the amount of available processing power independently of the received sensor signals 104s.

Figure 2B:
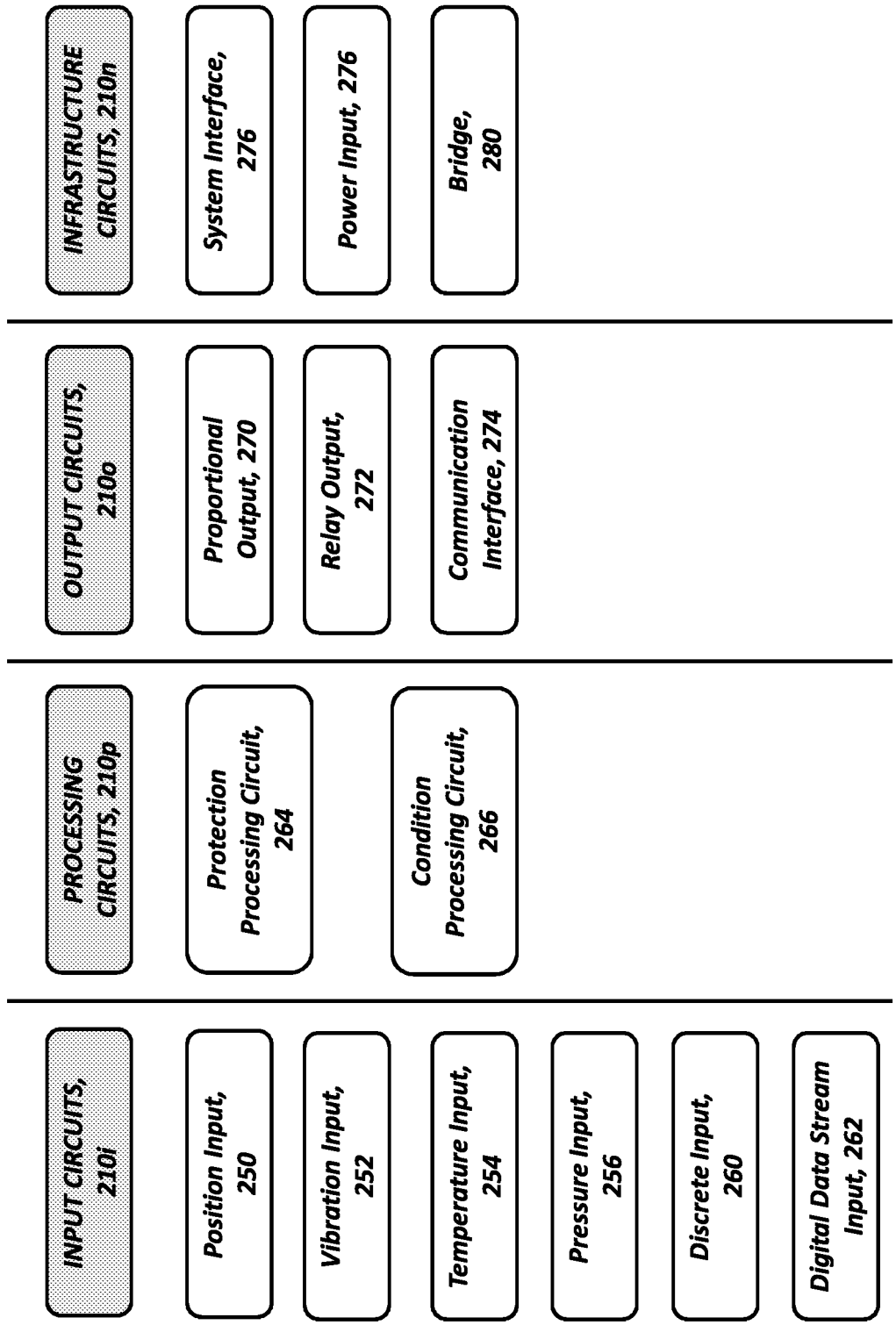
FIG. 2B is a diagram illustrating exemplary embodiments of circuits configured for use with the flexible monitoring system of FIG. 2A.

In certain embodiments, the circuits 210 of the flexible monitoring system 202 can be configured to provide at least functionality similar to that of circuits 152a, 154a, 156a, 160a of the monitoring system 106. Exemplary embodiments of circuits 210 are illustrated in FIGS. 2A-3 and discussed in detail below. As an example, circuits 210 can include input circuits 210i, processing circuits 210p, output circuits 210o, and infrastructure circuits 210n. It can be understood, however, that the circuits 210 can be programmed to perform other functions. Further discussion of the circuits 210 can also be found in U.S. patent application Ser. No. 15/947,716 entitled "Gated Asynchronous Multipoint Network Interface Monitoring System," the entirety of which is incorporated by reference. Accordingly, the flexible monitoring system 202 can be configured to receive sensor signals 104s and output monitoring signals 206s, 208s to the internal and external networks 110a, 110b, respectively. As discussed in detail below, further embodiments of the flexible monitoring system 202 can receive command signals 209s, 211s from the internal and external networks 110a, 110b, respectively, without compromising security of the machine control system 112. As a result, the flexible monitoring system 202 can be a suitable replacement for existing deployments of monitoring systems 106 while providing improved flexibility and functionality.

With this architecture, the circuits 210 can be combined in various ways on one or more backplanes 206 to form different implementations of the flexible monitoring system 202. The number of bases 204, input circuits 210i, processing circuits 210p, output circuits 210o, and infrastructure circuits 210n included in a given implementation of the flexible monitoring system 202 can also be varied independently of one another. In some implementations, the flexible monitoring system 202 can be in the form of a single base 204 including circuits 210 configured to provide signal input, signal output, protection monitoring, condition monitoring, and combinations thereof. In other implementations, the flexible monitoring system 202 can be in the form of at least two bases 204 and circuits 210 configured to perform any combination of signal input, signal output, protection monitoring, and condition monitoring can be distributed between the at least two bases 204. In this manner, the input, processing, and output capabilities of the flexible monitoring system 202, as well as the physical location of different circuits 210 of the flexible monitoring system 202, can be tailored to specific monitoring applications.

Furthermore, implementations of the flexible monitoring system 202 can be modified after initially deployed to modify the circuits 210 coupled to a given base 204 in the event that the intended monitoring application changes. Given their common architecture, circuits 210 can be easily added to a base 204 having capacity to couple to a new circuit 210. Alternatively, one or more new bases 204 can be communicative coupled to an existing base 204, allowing one or more new circuits 210 to be couple to respective backplane(s) 206 of the new base(s) 204 and expanding the monitoring capabilities of the flexible monitoring system 202. In some instances, circuits 210 removed from one base 204 of the flexible monitoring system 202 can be stored in reserve as spares or redeployed to another base 204 of the same or a different implementations of the flexible monitoring system 202, which may be beneficial.

In certain embodiments, input circuits 210i can be configured to receive sensor signals 104s, perform signal conditioning on the sensor signals 104s, and output the conditioned sensor signals 104s to the backplane 206. In contrast to the monitoring system 106 of FIGS. 1A-1B, the input circuits 210i can be decoupled from processing circuits 210p, allowing the number of input circuits 210i of the flexible monitoring system 202 to be varied independently of the number of processing circuits 210p.

The sensor signals 104s can be received from a variety of different types of sensors 104. Examples of sensor types can include, but are not limited to, vibration sensors, temperature sensors (e.g., resistance temperature detectors or RTD), position sensors, and pressure sensors. Notably, the ability of the input circuits 210i to transmit sensor signals 104s to the backplane 206/common backplane 206' can decouple the input circuits 210i from any specific processing circuits 210p, allowing any one or more of the processing circuits 210p to perform analysis on any measured operating parameters, in some embodiments.

Embodiments of the flexible monitoring system 202 can include one or more input circuits 210i. As shown in the FIG. 2A, the flexible monitoring system 202 includes two input circuits 210i. Each of the input circuits 210i can be in communication with a respective sensor 104 for receipt of a corresponding sensor signal 104s (e.g., acquired by a first sensor). As an example, one sensor signal 104s can represent first monitoring data including measurements of a first operating parameter of a first machine component. The other sensor signal 104s can represent second monitoring data including measurements of a second operating parameter of a second machine component (e.g., acquired by a second sensor, different from the first sensor). In certain embodiments, the first and second machine components can be the same (e.g., the target 102). In other embodiments, the first and second machine components can be different (e.g., the target 102 and a different target [not shown]). Similarly, in some embodiments, the first and second operating parameters can be the same operating parameter. In one aspect, this configuration can provide redundancy in case of failure of one of the sensors 104. In another aspect, this configuration can be utilized where a desired measurement (e.g., shaft rotation speed) is derived from two sensor measurements coordinated in time (phase). In additional embodiments, the first and second operating parameters can be different. While two input circuits 210i have been illustrated and discussed, other embodiments of the monitoring system can include greater or fewer input circuits.

Different types of sensors 104 can generate sensor signals 104s in different formats, and input circuits 210i can be programmed to perform signal conditioning appropriate to the different sensor signals 104s before transmitting conditioned sensor signals to the backplane 206. As an example, a sensor signal 104s received from a position sensor can be received by a position input circuit 250. A sensor signal 104s received from a vibration sensor can be received by a vibration input circuit 252. A sensor signal 104s received from a temperature sensor can be received by a temperature input circuit 254. A sensor signal 104s received from a pressure sensor can be received by a pressure input circuit 256.

In other embodiments, the input circuit 210i can be in the form of a discrete contact circuit 260. The discrete contact circuit 260 can include a pair of contacts that can be closed by an external switch or relay. The pair of contacts can be closed by the machine control system 112 or by an operator of the machine control system 112 closing a switch. The discrete contact circuit 260 can be used to change the behavior of the flexible monitoring system 202. Examples of behavior changes can include, but are not limited to, a different mode of machine operation, causing the flexible monitoring system 202 to inhibit alarm determination, and resetting alarm states.

While the monitoring system 106 can include a discrete contact, it can lack specificity. As an example, changes effected by closing a discrete contact in the measurement system 106 can be effected upon all alarms generated by the measurement system 106. In contrast, because the discrete contact circuit 260 of the flexible monitoring system 202 are separate from the protection processing circuit 264, the discrete contact circuit 260 can be configured to effect only selected alarm determinations and/or reset alarm states, or effect .

In further embodiments, the input circuit 210i can be in the form of a digital data stream input circuit 262. As an example, the digital data stream input circuit 262 can be configured to receive digital data streams from the sensor 104, the machine control system 112, and/or a trusted third-party system, as opposed to an analog data stream (e.g., from sensor 104).

Processing circuits 210p can be configured to retrieve any data from the backplane 206, analyze the retrieved operating parameters, and output the results of such analysis. In certain embodiments, the processing circuits 210p can be configured to perform protection functions and can be referred to as protection processing circuits 264 herein. In other embodiments, the processing circuits 210p can be configured to retrieve selected data from the backplane 206 and transmit the retrieved information to the diagnostic system 120 for performing diagnostic and/or predictive functions (e.g., condition monitoring) and can be referred to as condition processing circuits 266 herein.

The number of processing circuits 210p and input circuits 210i included in a given implementation of the flexible monitoring system 202 can be varied independently of the one another. In certain embodiments, processing circuits 210p can be added to the backplane 206 or removed from the backplane to tailor the amount of computing resources available for protection monitoring and/or condition monitoring. In other embodiments, a given processing circuit 210p can be replaced by another processing circuit 210p having greater or less computing power.

Any of these scenarios can be beneficial under certain circumstances, providing computational flexibility to the flexible monitoring system 202 that can be tailored to a given application and/or modified as needed. In one instance, machines having relatively low importance can have higher cost pressures and lower processing requirements. In this circumstance, an implementation of the flexible monitoring system 202 can include processing circuits 210p having processing resources tailored for cost. In another instance, a particular monitoring application can require high processing requirements (e.g., for determining values characterizing the measured parameters, for output of monitoring data, etc.). In this circumstance, an implementation of the flexible monitoring system 202 can include processing circuits 210p having processing resources tailored for processing resources. Thus, the architecture of the flexible monitoring system 202 can allow adaptation for different use cases depending upon the priorities of the intended monitoring application.

The protection processing circuits 264 and the condition processing circuits 266 are discussed below with reference to different functionalities. However, protection processing circuits 264 can be programmed to perform any function of the condition processing circuits 266. Condition processing circuits 266 can be programmed to perform functions of the protection processing circuits 264, except for transmitting data to the backplane 206 and providing local storage. The ability to inhibit the condition processing circuit 266 from transmitting data to the backplane 206 can inhibit unauthorized intrusion and facilitate protection of the internal network 110a and machine control system 112.

Protection processing circuits 264 can be configured to retrieve selected monitoring data from the backplane 206 in response to receipt of a protection command. As an example, one or more protection commands can be transmitted to protection processing circuits 264 in the form of protection command signal 209s received from the internal network 110a (e.g., from an operator of the machine control system 112). The selected monitoring data can include at least a portion of the monitoring data transmitted to the backplane 206. The monitoring data transmitted to the backplane can be received from an input circuit 210i or another protection processing circuit 264. The protection processing circuits 264 can also be configured to determine a value characterizing the selected monitoring data and transmit the determined value to the backplane 206 as additional monitoring data.

The protection processing circuit 264 can be configured to determine a status for the selected monitoring data based upon a comparison of the determined value, another determined value retrieved from the backplane 206 (e.g., from another protection processing circuit 264), and combinations thereof, with one or more predetermined set points. Predetermined set points can correspond to respective alarm conditions (e.g., an Alert condition, a Danger condition, etc.). Continuing the example above, where the determined value is an amplitude of a radial vibration, the one or more set points can include an Alert set point, a Danger set point that is greater than the Alert set point, and combinations thereof. In certain embodiments, a single set point can be employed. Assuming the use of Alert and Danger set points, if the radial vibration amplitude value is less than the Alert set point, the status of the radial vibration amplitude can be determined as "OK." If the radial vibration amplitude value is greater than or equal to the Alert set point, the status of the radial vibration amplitude can be determined as "Alert." If the radial vibration amplitude value is greater than the Danger set point, the status of the operating parameter can be determined as "Danger." After the status of the selected monitoring data is determined in this manner, the protection processing circuit 264 can transmit the determined status to the backplane 206.

The number of protection processing circuits 264 present in the flexible monitoring system 202 can be varied independently of the input circuits 210i. In certain embodiments, protection processing circuits 264 can be added to increase computing resources available to the flexible monitoring system 202. In other embodiments, protection processing circuits 264 can be removed or replaced to decrease computing resources available to the flexible monitoring system 202. Each can be beneficial under certain circumstances, providing computational flexibility to the flexible monitoring system 202.

The condition processing circuit 266 can be configured to retrieve selected monitoring data from the backplane 206 and to provide the retrieved monitoring data to the external network 110b for use by diagnostic system 120. In certain embodiments, the selected monitoring data can be retrieved by the condition processing circuit 266 in response to receipt of a conditioning command. As an example, one or more conditioning commands can be transmitted to condition processing circuits 266 in the form of conditioning command signals 211s can be received from the external network 110b. (e.g., from an operator of the diagnostic system 120). In turn, the diagnostic system 120 can utilize the retrieved monitoring data to determine the cause of statuses and/or alarm conditions. Alternatively or additionally, the diagnostic system 120 can also employ the retrieved monitoring data to predict the development of statuses and/or alarm conditions before they arise. In further embodiments, the diagnostic system 120 can store the retrieved monitoring data for subsequent analysis. In additional embodiments, the diagnostic system 120 can transmit the retrieved monitoring data to another computing device for analysis.

In further embodiments, the condition processing circuit 266 can retrieve the selected monitoring data from the backplane 206 based upon detection of a pre-determined status. As an example, the condition processing circuit 266 can retrieve and review statuses generated by the protection processing circuit 264 to identify a status matching the pre-determined status. The identified status can also include a status time characterizing the time when the status was determined. Upon identification of a match, the condition processing circuit 266 can retrieve selected monitoring data including operating parameter measurements corresponding to the pre-determined status for time durations before and/or after the status time. In this manner, the diagnostic system 120 can be provided with operating parameter information relevant to determining the cause of the status. The pre-determined statuses and selected monitoring data can be contained within the one or more conditioning commands.

The number of condition processing circuits 266 present in the flexible monitoring system 202 can be varied independently of the number of input circuits 210i. In certain embodiments, condition processing circuit 266 can be added to increase the ability of the flexible monitoring system 202 to output monitoring data. As an example, when two or more condition processing circuits 266 are present in the flexible monitoring system 202, each can tasked with output of different measured operating parameters. In another example, two or more condition processing circuits 266 can output the same measured operating parameters in order to provide redundancy. Each can be beneficial under certain circumstances, providing computational flexibility to the flexible monitoring system 202. In a further example, condition processing circuits 266 can be added to implement custom analytics without interfering with standard operation (e.g., when beta-testing a new analytic).

Output circuits 210o can be configured to obtain any monitoring data contained on the backplane 206 in response to receipt of output commands (e.g., contained in the one or more protection command signal 209s received from the internal network 110a). The output circuits 210o can further output the retrieved monitoring data to the internal network 110a in the form of monitoring signals 206s. Examples of monitoring data retrieved by output circuits 210o can include, but are not limited to, operating parameter measurements, the determined values, variables of the enhanced data set, statuses, and alarms.

In one aspect, output circuits 210o can be in the form of proportional output circuits 270. The proportional output circuits 270 can be configured to output monitoring signals 206s in the form of process control signals 300. The process control signals 300s can be proportional to process variables, such as direct measurement values or variables of the enhanced data set, as compared to a predetermined scale. As an example, a current output can be a 4-20 mA output. The process control signals 300s can be provided to the machine control system 112, either directly or via the internal network 110a, to facilitate control of operating parameters of the target 102. The process variables included in the process control signals 300 can be specified by the protection command signal 209s.

In further embodiments, output circuits 210o can be in the form of one or more relay circuits 272 configured to retrieve selected status data from the backplane 206 and to actuate based upon received alarm statuses to annunciate an alarm. Annunciated alarms can be output in the form of alarm signals 302s. In one example, relays can actuate based upon a single status. In another example, relays can actuate based upon predetermined Boolean expressions (e.g., AND or OR voting) that combine two or more statuses. The alarm signals 302s can be provided to the machine control system 112 via the internal network 110a, or directly to the machine control system 112, to facilitate control of operating parameters of the target 102. As an example, the machine control system 112 can shut down operation of the target 102 in response to receipt of an alarm signal 302s. The selected status data and the logic employed for actuation of a relay can be specified by the protection command signal 209s In other embodiments, output circuits 210o can be in the form of at least one communication interface circuits 274. The communication interface circuit 274 can be configured to retrieve selected monitoring data from the backplane 206 in response to receipt of the protection command signal 209s. The selected monitoring data can include one or more of the measured operating parameters, the measured variables of the enhanced data set, determined statuses, and determined alarms. The retrieved data can be transmitted to the internal network 110a in one or more return signals 306s for use by machine control system 212 (e.g., for process control), the HMI 114 (e.g., display to an operator) and/or stored by the historian 116.

Infrastructure circuits 210n can be configured to perform functionality required for the flexible monitoring system 202 to operate. In one aspect, infrastructure circuits 210n can take the form of a system interface circuit 276. The system interface circuit 276 can function as an access point for transmission of protection command signals 209s from the internal network 110a to the monitoring system 220, facilitating configuration of the circuits involved in protection monitoring (e.g., protection processing circuit 264, output circuits 210i). The protection command signals 209s can include one or more signals including any of the following in any combination: identification of selected monitoring data for each of the protection processing circuit 264 and output circuits 210i to retrieve and/or output, alarm set points for the protection processing circuit 264, and logic for annunciation of relays by relay output circuits 272.

It can be appreciated that, in contrast to the monitoring system 106, embodiments of the flexible monitoring system 202 can separate the circuits 210 that configure protection monitoring functions (e.g., the system interface circuit 276) and condition monitoring functionality (e.g., the condition processing circuit 266). As a result, protection monitoring configuration can be performed entirely on the internal network 110a while condition monitoring configuration can be performed entirely on the external network 110b. That is, the internal network 110a is not communicatively coupled to the external network 110b. As a result, conditioning command signals 211s can be provided to the condition processing circuit 266 without the need to obtain approval from an authorized operator of the machine control system 112.

In appreciation of cybersecurity risks inherent in allowing the condition processing circuit 266 to communicate with the external network 110b and the backplane 206, the condition processing circuit 266 can be limited to unidirectional communication with the backplane 206 for data retrieval only. Such unidirectional communication can be established by any combination of hardware (e.g., data diodes), firmware, and/or software. In certain embodiments, this unidirectional communication is provided at least through hardware. As a result, the flexible monitoring system 202 can be kept secure from malicious actors while facilitating rapid configuration of the condition processing circuit 266.

In another aspect, infrastructure circuits 210n can take the form of power input circuits 280. Power input circuits 280 can provide the ability to connect one or more power sources to the flexible monitoring system 202.

In a further aspect, infrastructure circuits 210n can take the form of bridge circuits 282. The bridge circuits 282 can provide the ability to connect the backplanes 206 of two or more bases 204 together and to form the common backplane 206' for communication therebetween.

Figure 4A:
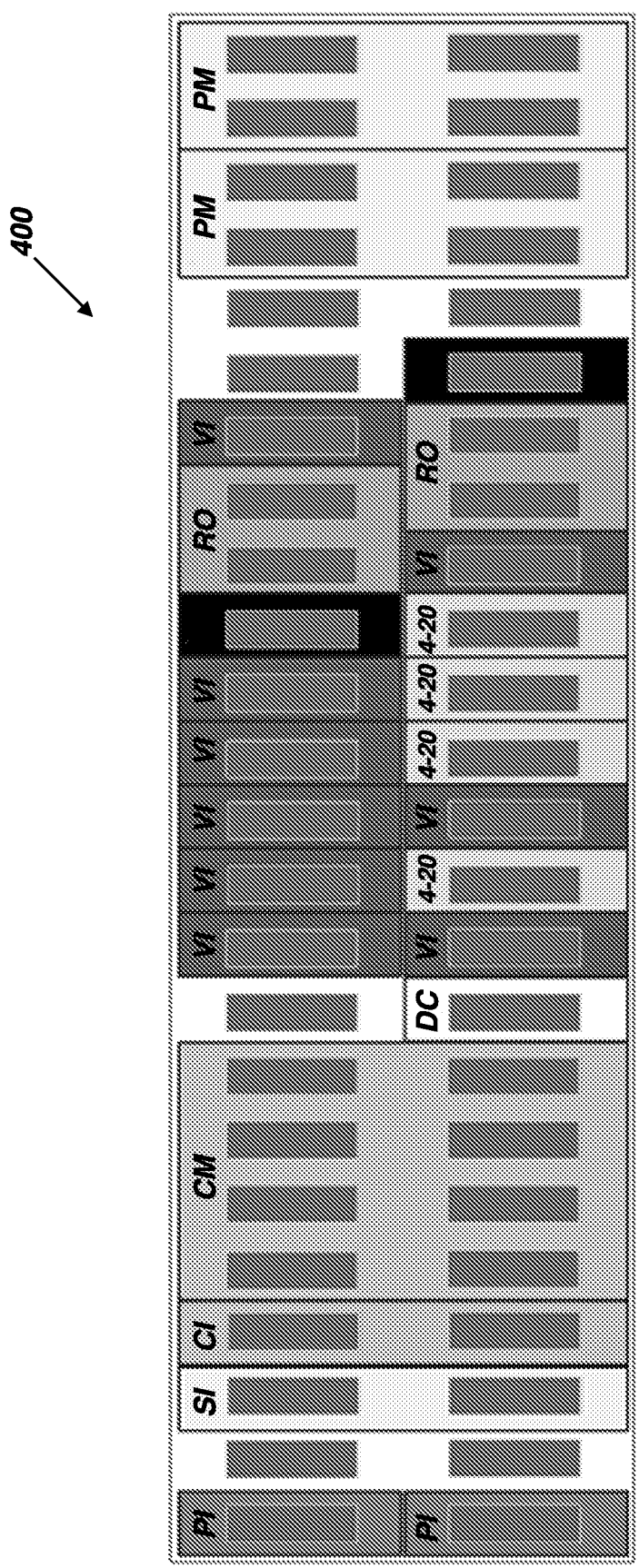
FIG. 4A is a diagram illustrating one exemplary embodiment of a relatively flexible large size monitoring system configured for protection monitoring and condition monitoring.
Figure 4B:
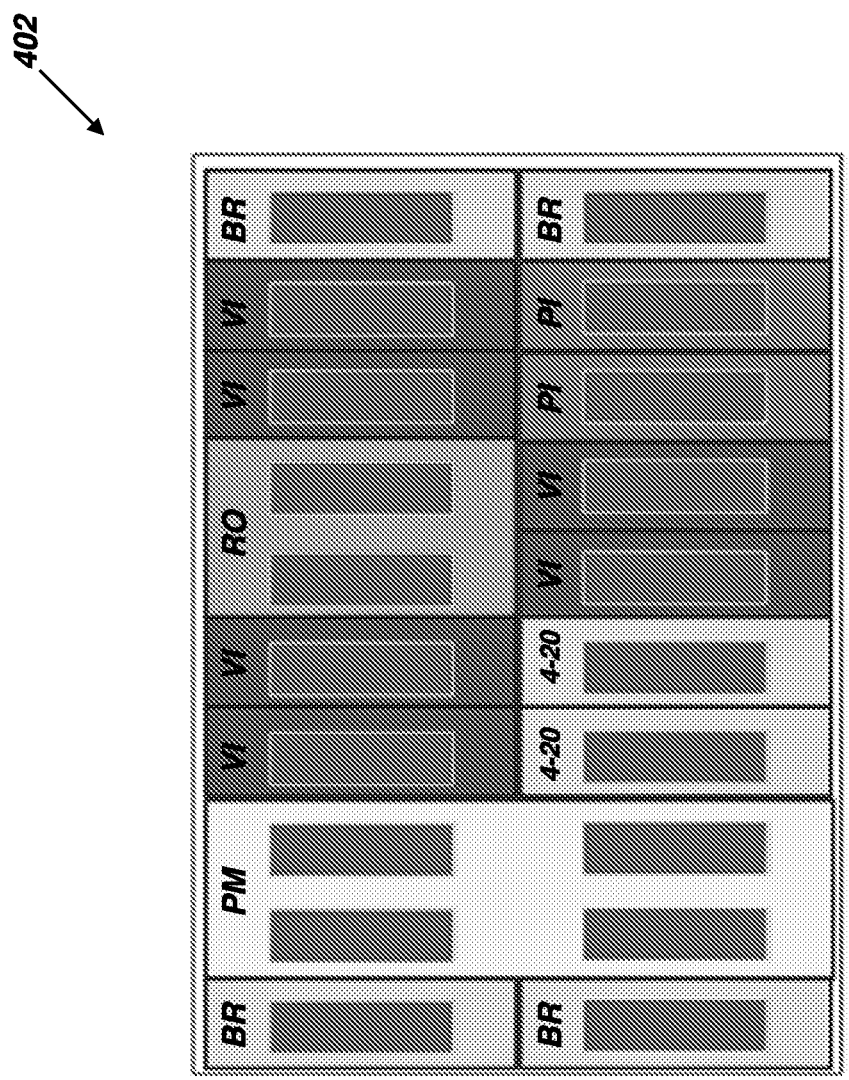
FIG. 4B is a diagram illustrating one exemplary embodiment of a medium size flexible monitoring system configured for protection monitoring.
Figure 4C:
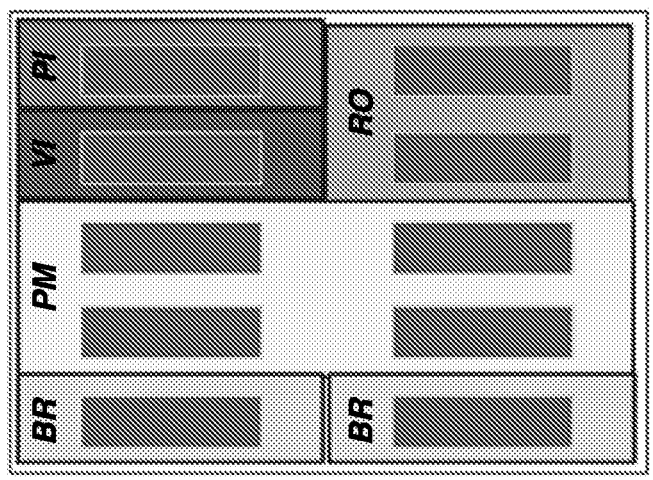
FIG. 4C is a diagram illustrating one exemplary embodiment of a small size flexible monitoring system configured for protection monitoring.

So configured, embodiments of the circuits 210 can be arranged in any combination distributed amongst one or more bases 204 to form implementations of the flexible monitoring system having desired monitoring capabilities (e.g., input, processing, output, etc.). Exemplary embodiments of flexible monitoring systems 202 constructed from different groupings of circuits 210 and bases 204 to provide different monitoring functions are illustrated in FIGS. 4A-4C, respectively. In each of the embodiments of FIGS. 4A-4C, the illustrated processing circuits 210p can be a single processing circuit 210p or two or more processing circuits 210p, as necessary for an intended application. Furthermore, provided that space is available to couple to the backplane 206, processing circuits 210p can be further added to the illustrated monitoring systems 202.

FIG. 4A illustrates the flexible monitoring system 202 in the form of flexible monitoring system 400 that can be considered as relatively large and it can be configured to perform both protection monitoring and condition monitoring for a variety of different sensor types. As shown, the flexible monitoring system 400 includes input circuits 210i such as vibration input circuits 252 (VI), temperature input circuits 254 (TI), a discrete contact 260 (DC). The flexible monitoring system 400 also include processing circuits 210p such as protection processing circuits 264 configured to provide protection monitoring functionality (PM) and condition processing circuits 266 configured to provide condition monitoring functionality (CM). The flexible monitoring system 400 can further include output circuits 210o, such as relay output circuits 272 (RO), proportional output circuits 270 (4-20), and communication interface circuits 274 (CI). The flexible monitoring system 400 can additionally include infrastructure circuits 210n, such as power input circuits 280 (PI) and system interface circuits 276 (SI).

FIG. 4B illustrates the flexible monitoring system 202 in the form of a flexible monitoring system 402 that can be smaller than the flexible monitoring system 400 (e.g., a "medium" system) and it can be configured to perform protection monitoring for a single type of sensor 104. As shown, the flexible monitoring system 402 includes input circuits 210i such as vibration input circuits 252 (VI). The flexible monitoring system 402 can also have processing circuits 210p including a protection processing circuits 264 (PM). The flexible monitoring system 402 can also include output circuits 210o such as relay output circuits 272 (RO) and proportional output circuits 270 providing 4 mA-20 mA outputs (4-20). The flexible monitoring system 402 can additionally include infrastructure circuits 210n, such as power input circuits 280 (PI) and bridge circuits 282 (BR).

FIG. 4C illustrates the flexible monitoring system 202 in the form of flexible monitoring system 404 that can be smaller than both of the flexible monitoring systems 400 and 402 (e.g., a "small" system) and it can be configured to perform protection monitoring for a single type of sensor 104. As shown in FIG. 4C, the flexible monitoring system 404 includes a single input circuit 210i, such as a vibration input circuit 252 (VI). The flexible monitoring system 404 can also have a processing circuit 210p including a protection processing circuit 264 (PM). The flexible monitoring system 404 can also include output circuits 210o such as relay output circuits 272 (RO). The flexible monitoring system 404 can additionally include infrastructure circuits 210n, such as power input circuits 280 (PI) and bridge circuits 282 (BR).

In further embodiments, the flexible monitoring system 202 can be composed of multiple bases 204 that are communicatively coupled through bridge circuits 282. In this manner, the common backplane 206' can extend across all of the bridge-coupled bases 204, where all information from the backplane 206 of each base 204 can be transmitted to the backplanes 206 of any other bases 204. In each of the embodiments of FIGS. 5-7, the illustrated processing circuits 210p can be a single processing circuit 210p or two or more processing circuits 210p, as necessary for an intended application. Furthermore, provided that space is available to couple to the backplane 206, processing circuits 210p can be further added to the illustrated monitoring systems 202. Multiple processing circuits 210p can be coupled to a single base 204 or distributed across two or more bases.

Figure 5:
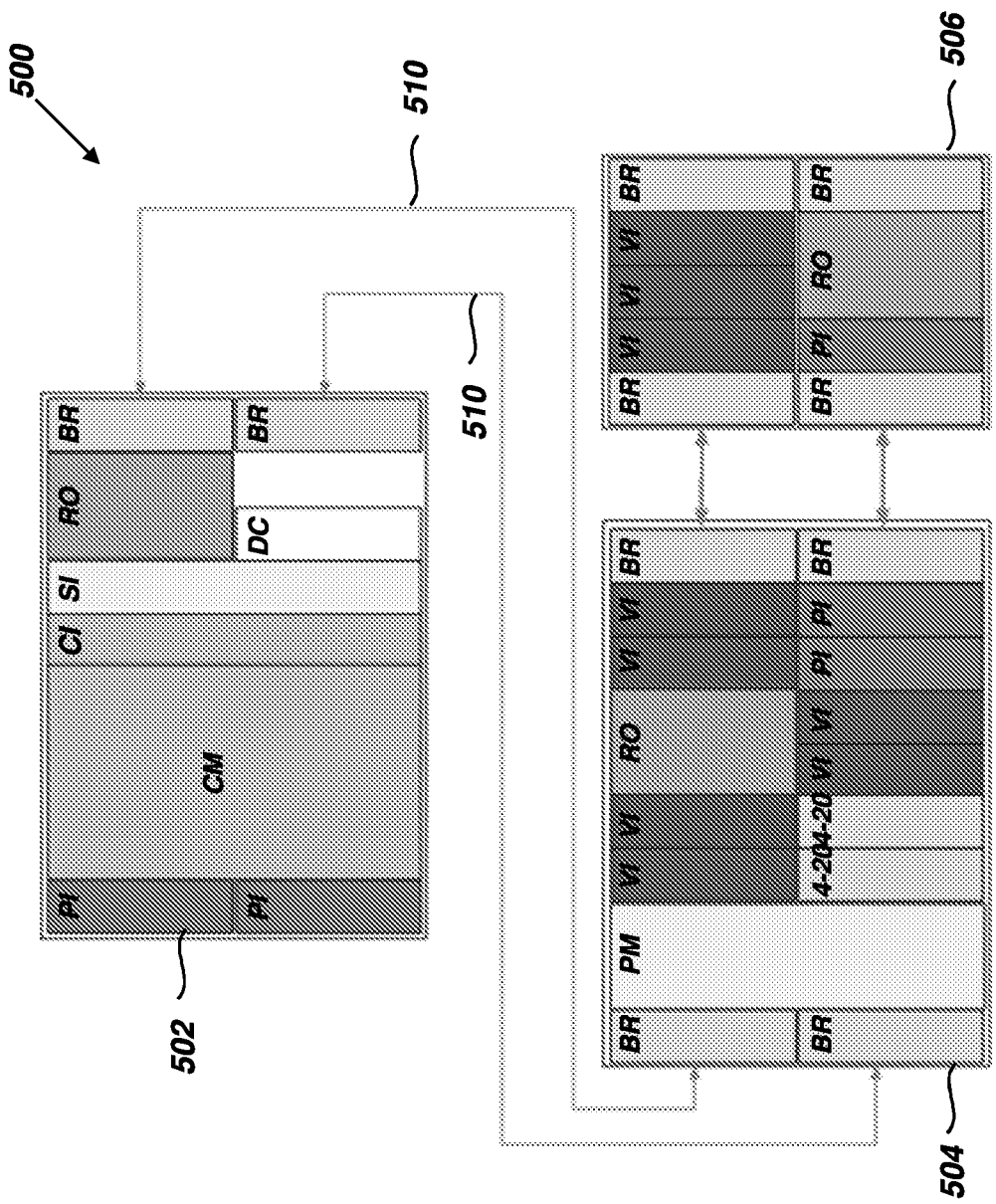
FIG. 5 is a diagram illustrating one exemplary embodiment of a flexible monitoring system including three bases communicatively coupled by bridge circuits and having input circuits, output circuits, a protection processing circuit, and a condition processing circuit distributed between the three bases.

An exemplary embodiment the flexible monitoring system 202 in the form of flexible monitoring system 500 is illustrated in FIG. 5. As shown, the flexible monitoring system 500 includes three bases, 502, 504, and 506 communicatively coupled to one another at their respective bridge circuits 282 (BR) using communication links 510. The communication links 510 can be any communication connection including, but not limited to, electrical cables, fiber optic cables, and wireless communication. The base 502 can contain discrete contacts 260, condition processing circuits 266 (CM), relay output circuits 272 (RO), and communication interface circuit 274 (CI). The base 504 can contain vibration input circuits 252 (VI), protection processing circuits 264 (PM), relay output circuits 272 (RO), and proportional output circuits 270 providing 4 mA-20 mA outputs (4-20). The base 506 can contain vibration input circuits 252 (VI) and relay output circuits 272 (RO). Each of the bases 502, 504, 506 can also include respective bridge circuits 282 (BR) and power input circuits 280 (PI). Protection command signals 209s can be provided to each of the bases 502, 504, 506, via the common backplane 206', using the system interface circuit 276 (SI) mounted to the base 502.

Figure 6:
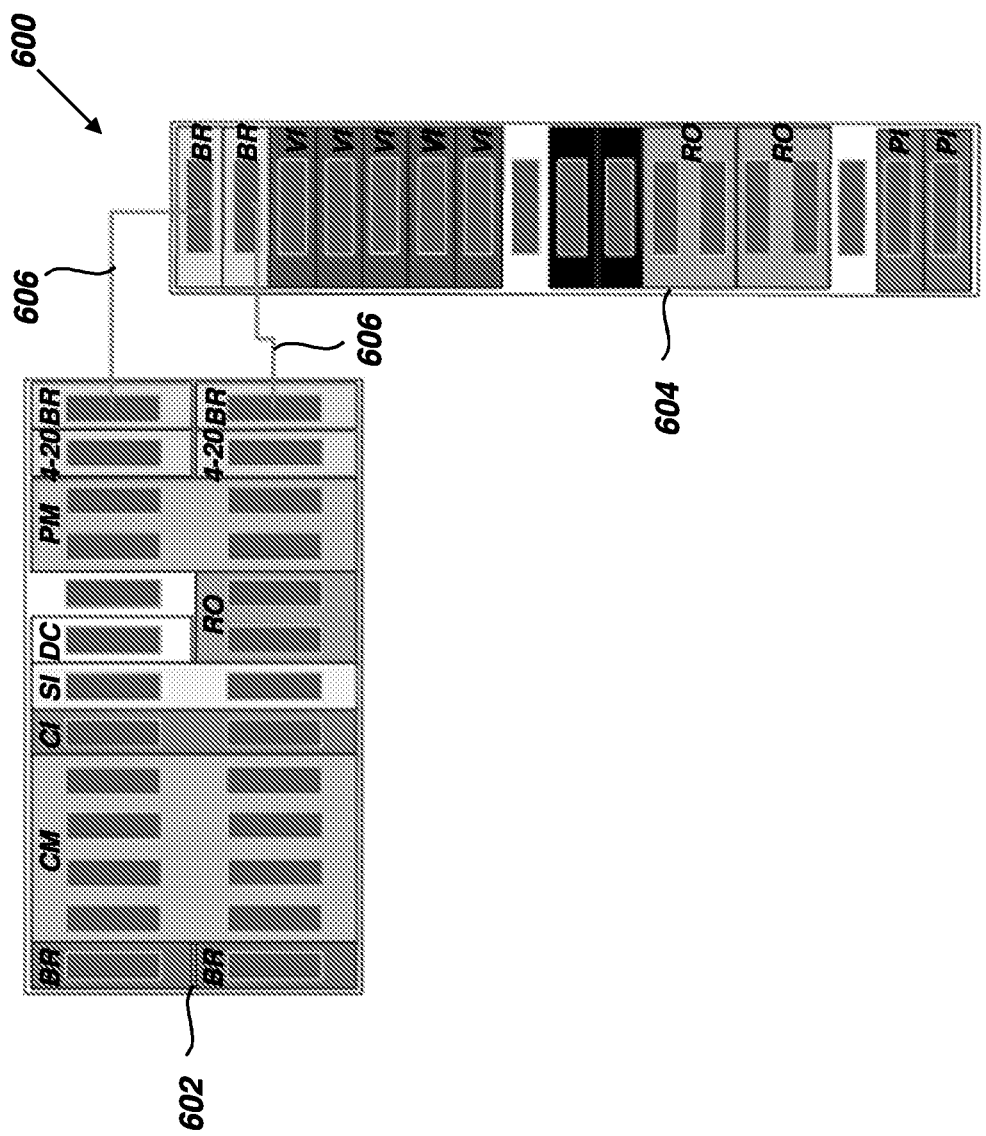
FIG. 6 is a diagram illustrating one exemplary embodiment of a flexible monitoring system including two bases communicatively coupled by bridge circuits and having input circuits and output circuits coupled to one base and protection processing circuits and condition processing circuits coupled to the other base.

Another exemplary embodiment of the flexible monitoring system 202 in the form of flexible monitoring system 600 is illustrated in FIG. 6. As shown, the flexible monitoring system 600 includes two bases, 602 and 604 communicatively coupled to one another at their respective bridge circuits 282 (BR) using communication links 606, similar to communication links 510. The base 602 can contain all processing circuits 210p, while the base 604 can contain all or substantially all of the input circuits 210i and the output circuits 210o. The base 604 can be located remotely from the base 602, such as in a marshaling cabinet, while the base 602 can remain close to a control room for ease of access.

Figure 7:
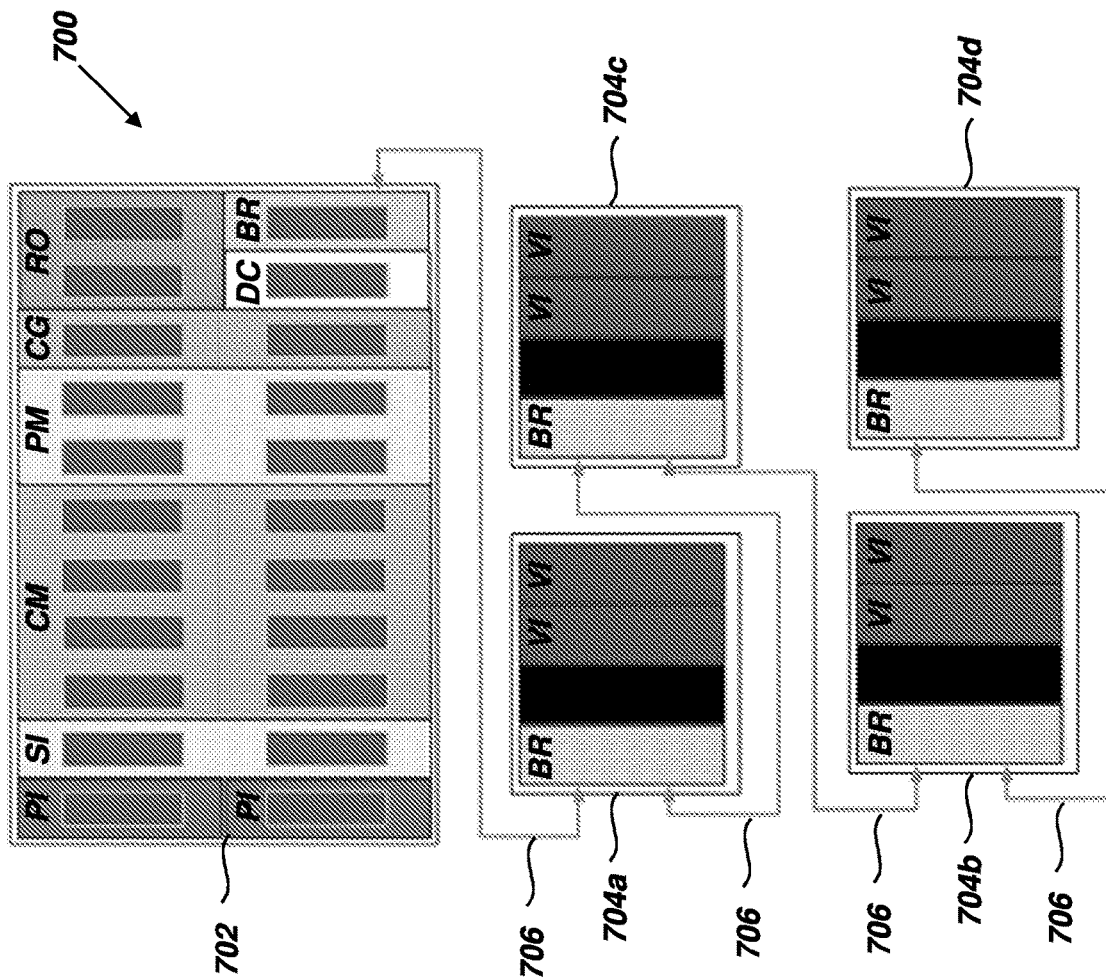
FIG. 7 is a diagram illustrating one exemplary embodiment of a flexible monitoring system including five bases communicatively coupled by bridge circuits and having input circuits and output circuits coupled to multiple small bases and protection processing circuits and condition processing circuits coupled to a larger base for efficiency.

In order to improve the efficiency of embodiments of the flexible monitoring system 202, circuits 210 can be segregated by function and shared between respective bases 204 over the bridge circuits 282 (BR). An exemplary embodiment of the flexible monitoring system 202 in the form of flexible monitoring system 700 is illustrated in FIG. 7. As shown, the flexible monitoring system 700 includes five bases, 702, 704a, 704b, 704c, 704d. The base 702 includes both protection processing circuits 264 (PM) and condition processing circuits 266 (CM). The bases 704a-704d are each the same and include temperature input circuits 254 (TI) and vibration input circuits 252 (VI). The bases 702 and 704a-704d are communicatively coupled to one another at their respective bridge circuits 282 (BR) by communication links 706, which can be the same as communication links 510. This configuration can allow the expensive common circuits (e.g., protection processing circuit 264, condition processing circuit 266, communication interface circuit 274, system interface circuit 276) to be housed in base 702 and placed close to a control room. Input circuits 210i, such as temperature input circuits 256 (TI) and vibration input circuits 254 (VI)) can be housed in bases 704a-704d to be used for monitoring several small machines and positioned local to the monitored machine(s).

FIG. 8 is a flow diagram illustrating an exemplary embodiment of a method 800 for monitoring a machine. The method 800 is discussed in with reference to the flexible monitoring system 202. In certain aspects, embodiments of the method 800 can include greater or fewer operations than illustrated in FIG. 8 and the operations can be performed in a different order than illustrated in FIG. 8.

In operation 802, a plurality of circuits can be coupled to at least one backplane (e.g., 206). The plurality of circuits can include an input circuit (e.g., 210i) and at least one processing circuit (e.g., 210p). The plurality of circuits can also include at least one of output circuits (e.g., 210O) and infrastructure circuits 210n. As an example, a circuit can be inserted into a slot or port of the backplane 206.

In operation 804, the input circuit 210i can transmit monitoring data to the backplane 206 to which the input circuit 210i is coupled. The monitoring data can represent measurements of an operating parameter of a machine component that is acquired by a sensor.

In operation 806, the at least one processing circuit can perform at least one the following: retrieving a selected portion of the monitoring data from the backplane to which the at least one processing circuit is coupled, and determining a value characterizing the selected monitoring data and transmit the determined value to the backplane to which the at least one processing circuit is coupled. The number of processing circuits coupled to the at least one backplane can independent from the number of input circuits coupled to the at least one backplane.

Exemplary technical effects of the methods, systems, and devices described herein include, by way of non-limiting example, flexible monitoring circuits that possess a common architecture. The common architecture can reduce the number of components that are managed within a flexible monitoring system and allow the use of common spares across different implementations of the flexible monitoring systems. The common architecture of the monitoring circuits can also allow them to operate similarly, providing a reduction in problems due to misunderstanding of differences in behavior of different monitoring systems. The common architecture can further allow the monitoring circuits to be arranged in any combination to form new implementations of the flexible monitoring system that have desired machine monitoring capabilities. The monitoring circuits can include bridging circuits that are configured to facilitate communication that establishes a common backplane between backplanes of respective monitoring system bases. This configuration can allow the monitoring circuits to transmit and/or receive data from the common backplane, regardless of the physical backplane to which they are coupled. Computational processing capacity for protection monitoring and/or condition monitoring can be increased or decreased by addition or removal of processing circuits from the monitoring system, independently of received sensor signals.

Certain exemplary embodiments have been described to provide an overall understanding of the principles of the structure, function, manufacture, and use of the systems, devices, and methods disclosed herein. One or more examples of these embodiments have been illustrated in the accompanying drawings. Those skilled in the art will understand that the systems, devices, and methods specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present invention. Further, in the present disclosure, like-named components of the embodiments generally have similar features, and thus within a particular embodiment each feature of each like-named component is not necessarily fully elaborated upon.

The subject matter described herein can be implemented in analog electronic circuitry, digital electronic circuitry, and/or in computer software, firmware, or hardware, including the structural means disclosed in this specification and structural equivalents thereof, or in combinations of them. The subject matter described herein can be implemented as one or more computer program products, such as one or more computer programs tangibly embodied in an information carrier (e.g., in a machine-readable storage device), or embodied in a propagated signal, for execution by, or to control the operation of, data processing apparatus (e.g., a programmable processor, a computer, or multiple computers). A computer program (also known as a program, software, software application, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file. A program can be stored in a portion of a file that holds other programs or data, in a single file dedicated to the program in question, or in multiple coordinated files (e.g., files that store one or more modules, sub-programs, or portions of code). A computer program can be deployed to be executed on one computer or on multiple computers at one site or distributed across multiple sites and interconnected by a communication network.

The processes and logic flows described in this specification, including the method steps of the subject matter described herein, can be performed by one or more programmable processors executing one or more computer programs to perform functions of the subject matter described herein by operating on input data and generating output. The processes and logic flows can also be performed by, and apparatus of the subject matter described herein can be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processor of any kind of digital computer. Generally, a processor will receive instructions and data from a read-only memory or a random access memory or both. The essential elements of a computer are a processor for executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example semiconductor memory devices, (e.g., EPROM, EEPROM, and flash memory devices); magnetic disks, (e.g., internal hard disks or removable disks); magneto-optical disks; and optical disks (e.g., CD and DVD disks). The processor and the memory can be supplemented by, or incorporated in, special purpose logic circuitry.

To provide for interaction with a user, the subject matter described herein can be implemented on a computer having a display device, e.g., a CRT (cathode ray tube) or LCD (liquid crystal display) monitor, for displaying information to the user and a keyboard and a pointing device, (e.g., a mouse or a trackball), by which the user can provide input to the computer. Other kinds of devices can be used to provide for interaction with a user as well. For example, feedback provided to the user can be any form of sensory feedback, (e.g., visual feedback, auditory feedback, or tactile feedback), and input from the user can be received in any form, including acoustic, speech, or tactile input.

The techniques described herein can be implemented using one or more modules. As used herein, the term "module" refers to computing software, firmware, hardware, and/or various combinations thereof. At a minimum, however, modules are not to be interpreted as software that is not implemented on hardware, firmware, or recorded on a non-transitory processor readable recordable storage medium (i.e., modules are not software per se). Indeed "module" is to be interpreted to always include at least some physical, non-transitory hardware such as a part of a processor or computer. Two different modules can share the same physical hardware (e.g., two different modules can use the same processor and network interface). The modules described herein can be combined, integrated, separated, and/or duplicated to support various applications. Also, a function described herein as being performed at a particular module can be performed at one or more other modules and/or by one or more other devices instead of or in addition to the function performed at the particular module. Further, the modules can be implemented across multiple devices and/or other components local or remote to one another. Additionally, the modules can be moved from one device and added to another device, and/or can be included in both devices.

The subject matter described herein can be implemented in a computing system that includes a back-end component (e.g., a data server), a middleware component (e.g., an application server), or a front-end component (e.g., a client computer having a graphical user interface or a web browser through which a user can interact with an implementation of the subject matter described herein), or any combination of such back-end, middleware, and front-end components. The components of the system can be interconnected by any form or medium of digital data communication, e.g., a communication network. Examples of communication networks include a local area network ("LAN") and a wide area network ("WAN"), e.g., the Internet.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

One skilled in the art will appreciate further features and advantages of the invention based on the above-described embodiments. Accordingly, the present application is not to be limited by what has been particularly shown and described, except as indicated by the appended claims. All publications and references cited herein are expressly incorporated by reference in their entirety.

The invention claimed is:

1. A system, comprising:
   at least one backplane configured to couple to a plurality of circuits, and to receive monitoring data from at least one of the plurality of circuits coupled to the backplane;
   an input circuit coupled to one of the at least one backplane and configured to receive a sensor signal representing monitoring data including measurements of an operating parameter of a machine component from a sensor and to transmit the monitoring data to the backplane to which the input circuit is coupled;
   at least one processing circuit coupled to a backplane of one of the at least one backplane, wherein a number of processing circuits coupled to the at least one backplane is independent from a number of input circuits coupled to the at least one backplane and the at least one processing circuit is configured to perform at least one of:
      retrieving a selected portion of the monitoring data from the backplane to which the at least one processing circuit is coupled, and
      determining a value characterizing the selected monitoring data and transmitting the determined value to the backplane to which the at least one processing circuit is coupled; and
   a first processing circuit comprising a first condition processing circuit coupled to a first backplane, the first condition processing circuit configured to retrieve a first portion of the monitoring data from the first backplane and to output the first portion of the monitoring data to a network; and second processing circuit comprising a second condition processing circuit coupled to a second backplane, the second condition processing circuit configured to retrieve a second portion of the monitoring data from the second backplane, and to output the second portion of the monitoring data to the network;

wherein the first and second condition processing circuits are prohibited from transmitting data to any of the at least one backplane.

2. The system of claim 1, comprising:

a first processing circuit comprising a first protection processing circuit coupled to a first backplane, the first protection processing circuit configured to retrieve a first portion of the monitoring data from the first backplane, to determine a first portion of the value based upon the first portion of the monitoring data, and to transmit the first portion of the value to the first backplane;

a second processing circuit comprising a second protection processing circuit coupled to a second backplane, the second protection processing circuit configured to retrieve a second portion of the monitoring data, different from the first portion, determine a second portion of the value based upon the second portion of the monitoring data, and to transmit the second portion of the value to the second backplane.

3. The system of claim 2, wherein the first protection processing circuit is configured to retrieve the second portion of the value from the second backplane, to determine the value based upon the first and second value portions, and to transmit the determined value to the first backplane.

4. The system of claim 3, wherein the first and second backplanes are the same backplane.

5. The system of claim 4, wherein the input circuit is coupled to the first backplane.

6. The system of claim 4, wherein the input circuit is coupled to a third backplane, different from the first backplane, and wherein the system further comprises:

a first bridge circuit coupled to the first backplane; and
a second bridge circuit coupled to the third backplane and in communication with the first bridge circuit, the first and second bridge circuits forming a common logical backplane including the first and third backplanes;

wherein the first and second protection processing circuits are configured to retrieve the first and second monitoring data portions from the third backplane via the common logical backplane.

7. The system of claim 3, wherein the first and second backplanes are different backplanes and wherein the system further comprises:

a first bridge circuit coupled to the first backplane; and
a second bridge circuit coupled to the second backplane and in communication with the first bridge circuit, the first and second bridge circuits forming a common logical backplane including the first and second backplanes;

wherein the first protection processing circuit is configured to retrieve the second portion of the value from the second backplane via the common logical backplane.

8. The system of claim 1, wherein the first and second backplanes are the same backplane.

9. The system of claim 8, wherein the input circuit is coupled to the first backplane.

10. The system of claim 8, wherein the input circuit is coupled to a third backplane, different from the first backplane, and wherein the system further comprises:

a first bridge circuit coupled to the first backplane; and
a second bridge circuit coupled to the third backplane and in communication with the first bridge circuit, the first and second bridge circuits forming a common logical backplane including the first and third backplanes;

wherein the first and second condition processing circuits are configured to retrieve the first and second monitoring data portions from the third backplane via the common logical backplane.

11. A method, comprising:

coupling a plurality of circuits to at least one backplane, the plurality of circuits including an input circuit and at least one processing circuit;

transmitting, by the input circuit, monitoring data to the backplane to which the input circuit is coupled, the monitoring data representing measurements of an operating parameter of a machine component acquired by a sensor, wherein a number of processing circuits coupled to the at least one backplane is selected independently from a number of input circuits coupled to the at least one backplane; and performing, by the at least one processing circuit, at least one of:
retrieving a selected portion of the monitoring data from the backplane to which the at least one processing circuit is coupled,
determining a value characterizing the selected monitoring data and transmitting the determined value to the backplane to which the at least one processing circuit is coupled, retrieving, by a first processing circuit comprising a first condition processing circuit coupled to a first backplane, a first portion of the monitoring data from the first backplane, outputting, by the first condition processing circuit, the first portion of the monitoring data to a network, retrieving, by a second processing circuit comprising a second condition processing circuit coupled to a second backplane, a second portion of the monitoring data from the second backplane, and outputting, by the second condition processing circuit, the second portion of the monitoring data to the network, wherein the first and second condition processing circuits are prohibited from transmitting data to the first and second backplanes, respectively.

12. The method of claim 11, comprising:

retrieving, by a first processing circuit comprising a first protection processing circuit coupled to a first backplane, a first portion of the monitoring data from the first backplane;

determining, by the first protection processing circuit, a first portion of the value based upon the first portion of the monitoring data;

transmitting the first portion of the value to the first backplane;

retrieving, by a second protection processing circuit comprising a second processing circuit coupled to a second backplane, a second portion of the monitoring data from the second backplane;

determining, by the second protection processing circuit, a second portion of the value based upon the second portion of the monitoring data; and transmitting the second portion of the value to the second backplane.

13. The method of claim 12, comprising:
retrieving, by the first protection processing circuit, the second portion of the value from the second backplane,
determining, by the first protection processing circuit, the value based upon the first and second value portions, and
transmitting, by the first protection processing circuit, the determined value to the first backplane.

14. The method of claim 13, wherein the first and second backplanes are the same backplane.

15. The method of claim 14, comprising coupling the input circuit to the first backplane.

16. The method of claim 13, wherein the input circuit is coupled to a third backplane, different from the first backplane, and wherein the method comprises:
coupling a first bridge circuit to the first backplane;
coupling a second bridge circuit to the third backplane; and
placing the first and second bridge circuits in communication, the first and second bridge circuits forming a common logical backplane including the first and third backplanes when in communication;
wherein the first and second protection processing circuits are configured to retrieve the first and second monitoring data portions from the third backplane via the common logical backplane.

17. The method of claim 12, wherein the first and second backplanes are different backplanes, and wherein the method comprises:
coupling a first bridge circuit to the first backplane;
coupling a second bridge circuit to the second backplane; and
placing the first and second bridge circuits in communication, the first and second bridge circuits forming a common logical backplane including the first and second backplanes when in communication;
wherein the first protection processing circuit is configured to retrieve the second portion of the value from the second backplane via the common logical backplane.

18. The method of claim 12, wherein the input circuit is coupled to a third backplane, different from the first backplane, and wherein the method comprises:
coupling a first bridge circuit to the first backplane;
coupling a second bridge circuit to the third backplane; and
placing the first and second bridge circuits in communication, the first and second bridge circuits forming a common logical backplane including the first and third backplanes when in communication;
wherein the first and second condition processing circuits are configured to retrieve the first and second monitoring data portions from the third backplane via the common logical backplane.

19. The method of claim 11, wherein the first and second backplanes are the same backplane.

20. The method of claim 19, wherein the input circuit is coupled to the first backplane.

* * * * *